(12) United States Patent
Boutaud

(10) Patent No.: US 6,600,345 B1
(45) Date of Patent: Jul. 29, 2003

(54) GLITCH FREE CLOCK SELECT SWITCH

(75) Inventor: Frederic Boutaud, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/002,921

(22) Filed: Nov. 15, 2001

(51) Int. Cl.[7] .............................................. H03K 17/00
(52) U.S. Cl. ......................... 327/99; 327/294; 327/298
(58) Field of Search ......................... 327/99, 298, 407, 327/144, 293, 294, 141; 326/93, 96; 331/49

(56) References Cited

U.S. PATENT DOCUMENTS

| | | | | | |
|---|---|---|---|---|---|
| 4,853,653 A | * | 8/1989 | Maher | ......................... | 331/49 |
| 4,899,351 A | * | 2/1990 | Bonke | ......................... | 375/357 |
| 4,970,405 A | * | 11/1990 | Hagiwara | ................... | 327/145 |
| 5,315,181 A | * | 5/1994 | Schowe | ....................... | 326/93 |
| 5,357,146 A | * | 10/1994 | Heimann | ................... | 327/292 |
| 5,604,452 A | * | 2/1997 | Huang | ......................... | 327/99 |
| 5,652,536 A | * | 7/1997 | Nookala | ..................... | 327/298 |
| 5,675,615 A | * | 10/1997 | Watt | ............................ | 375/354 |
| 5,726,593 A | * | 3/1998 | Ruuskanen | ................. | 327/99 |
| 6,154,508 A | * | 11/2000 | Ott | ............................. | 375/354 |
| 6,239,626 B1 | * | 5/2001 | Chesavage | ................... | 327/99 |
| 6,265,930 B1 | * | 7/2001 | Walker et al. | ............. | 327/407 |
| 6,275,546 B1 | * | 8/2001 | Miller et al. | ............... | 375/354 |
| 6,452,426 B1 | * | 9/2002 | Tamarapalli et al. | ......... | 327/99 |
| 6,453,425 B1 | * | 9/2002 | Hede et al. | ................. | 713/501 |

* cited by examiner

*Primary Examiner*—Timothy P. Callahan
*Assistant Examiner*—Hai L. Nguyen
(74) *Attorney, Agent, or Firm*—Samuels, Gauthier & Stevens, LLP

(57) ABSTRACT

A clock selection circuit for selecting one of a plurality of clocks as an output clock. When the selection circuit switches between two of the plurality of clocks for output, the currently output clock is removed from the output. The removal of the currently output clock is performed synchronously to the currently selected clock. The newly selected clock is then coupled to the output. Coupling of the newly selected clock is performed synchronously to the newly selected clock.

20 Claims, 18 Drawing Sheets

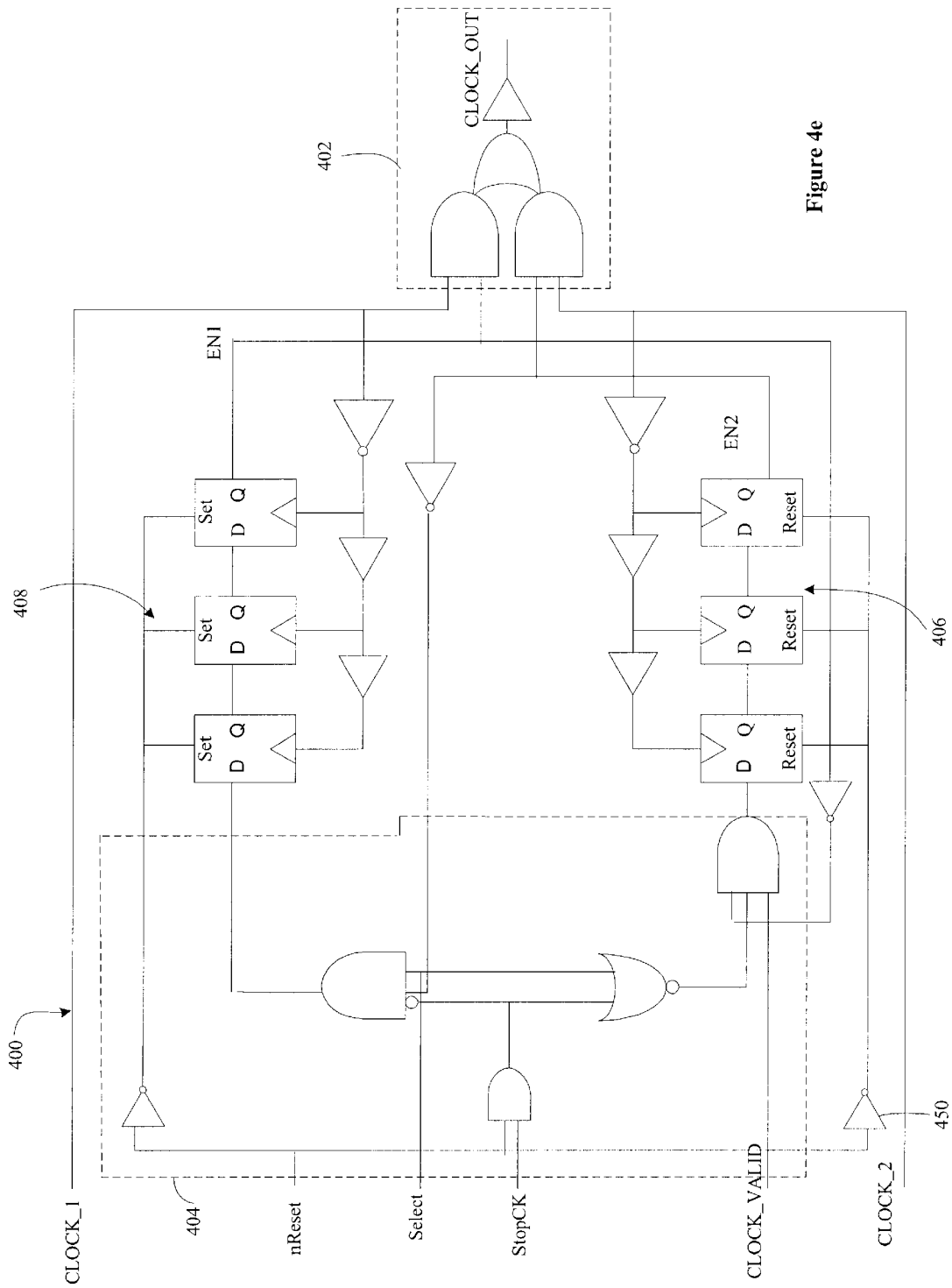

GLITCH FREE CLOCK SELECT SWITCH

BACKGROUND OF THE INVENTION

The invention relates to the field of clock selection, and in particular to glitch-free clock selection.

Digital electronic systems often rely upon a clock signal to synchronize and control the operation of the various circuit elements (e.g., gates, flip-flops, latches, etc.). In many present day digital electronic systems, such as microprocessor-based devices, there exist multiple clock sources and a concomitant need to switch between them.

When switching between clocks, it is preferable to avoid glitches and intermediate clock behavior on the clock output of the selection circuitry. FIGS. 1a and 1b help illustrate the occurrence of a glitch when switching between clock sources. FIG. 1a shows a typical circuit for switching between clock sources. As shown in FIG. 1a, two clock signals, CLOCK_1 and CLOCK_2, are provided as inputs to a switching circuit 100, such as a multiplexor. Multiplexor 100 also receives a Select signal, which switches the output signal, CLOCK_OUT, between the input signals CLOCK_1 and CLOCK_2. For instance, when the Select signal is high, CLOCK_1 is output on CLOCK_OUT and when the Select signal is low, CLOCK_2 is output on CLOCK_OUT. FIG. 1b illustrates a timing relationship between the Select signal, CLOCK_1 and CLOCK_2 that results in a glitch on CLOCK_OUT. As shown, the Select signal is initially high, resulting in CLOCK_1 being output on CLOCK_OUT. The Select signal then goes low while CLOCK_1 is high and CLOCK_2 is low. This results in a shortened pulse 102, i.e. a glitch, output on CLOCK_OUT.

Generally, a glitch signal causes errors during execution of a microprocessor and other components because a glitch may erratically clock subsequent flip-flops, latches, etc. Therefore, there is a need for a switching circuit that enables switching of the clock source, dynamically and cleanly, without any perturbation on the logic driven by the clock.

SUMMARY OF THE INVENTION

In one aspect of the present invention, a clock selection circuit for switching between a plurality of possible clocks is provided. A switch made from an existing clock to a new frequency clock is made in synchronization with both the existing and the new frequency clock. The clock selection circuit comprises a first clock input to receive the existing clock as input and a new frequency clock input to receive the new frequency clock. The circuit also comprises first synchronization logic associated with the first clock to enable/disable output of the existing clock and second synchronization logic associated with the new frequency clock to enable/disable output of the new frequency clock. The first synchronization and second synchronization logic cooperates to disable output of the existing clock synchronously to the existing clock and to enable output of the new frequency clock synchronously to the new frequency clock.

In another aspect of the present invention, a clock selection circuit for outputting an input clock signal selected from among a plurality of input clocks is provided. The circuit comprises enable logic responsive to a clock select input to generate, for each input clock, an associated select signal. Each select signal is indicative of whether or not its associated input clock is selected to be output. For each select signal, there is synchronization logic responsive to the select signal to generate an enable signal synchronously to the select signal's associated input clock. The enable signal is indicative of whether or not the select signal's associated clock is to be output. Output logic is responsive to the enable signals to output the selected input clock.

In another aspect of the present invention, a clock selection circuit for switching from a first clock signal coupled to an output to a second clock signal coupled to the output is provided. The circuit comprises enable logic responsive to a clock select signal to generate a first select signal that indicates the first clock is to be decoupled from the output and a second select signal that indicates the second clock signal is to be coupled to the output. First synchronization logic is responsive to the first select signal to generate a first enable signal synchronously to the first clock. The first enable signal indicates that the first clock is to be decoupled from the output. Second synchronization logic is responsive to the second select signal to generate a second enable signal synchronously to the second clock. The second enable signal indicates the second clock signal is to be coupled to the output. The first enable signal is generated before the second enable signal is generated. Output logic is responsive to the first enable signal to decouple the first clock signal from the output and responsive to the second enable signal to couple the second clock signal to the output.

In another aspect of the present invention, a method of switching from a first clock signal coupled to an output of a clock selection circuit to a second clock signal coupled to the output of the clock selection circuit is provided. An indication to switch from outputting the first clock signal to the second clock signal is received. The first clock is then removed from output synchronously to the first clock. The second clock signal is then coupled to the output synchronously to the second clock signal.

BRIEF DESCRIPTION OF THE DRAWINGS

FIG. 1b illustrates a timing relationship between the Select signal, CLOCK_1 and CLOCK_2 that results in a glitch on CLOCK_OUT for the circuit of FIG. 1a;

FIG. 2b illustrates a timing diagram for the circuit of FIG. 2a;

FIGS. 4b–4c illustrate timing diagrams for the selection circuit of FIG. 4a;

FIG. 4e illustrates another embodiment of the clock selection circuit of FIG. 4a without the internal enable signals connected to reset inputs of the flip-flops;

DETAILED DESCRIPTION OF THE INVENTION

Figure 1A:
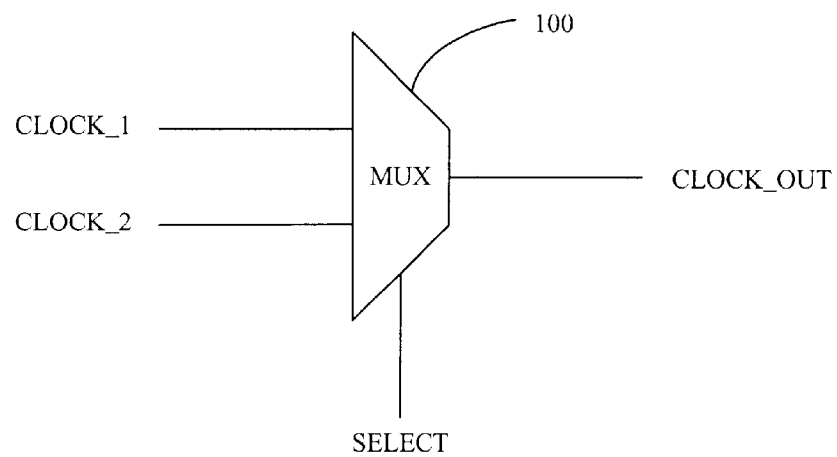
FIG. 1a illustrates a typical circuit for switching between clock sources.
Figure 1B:
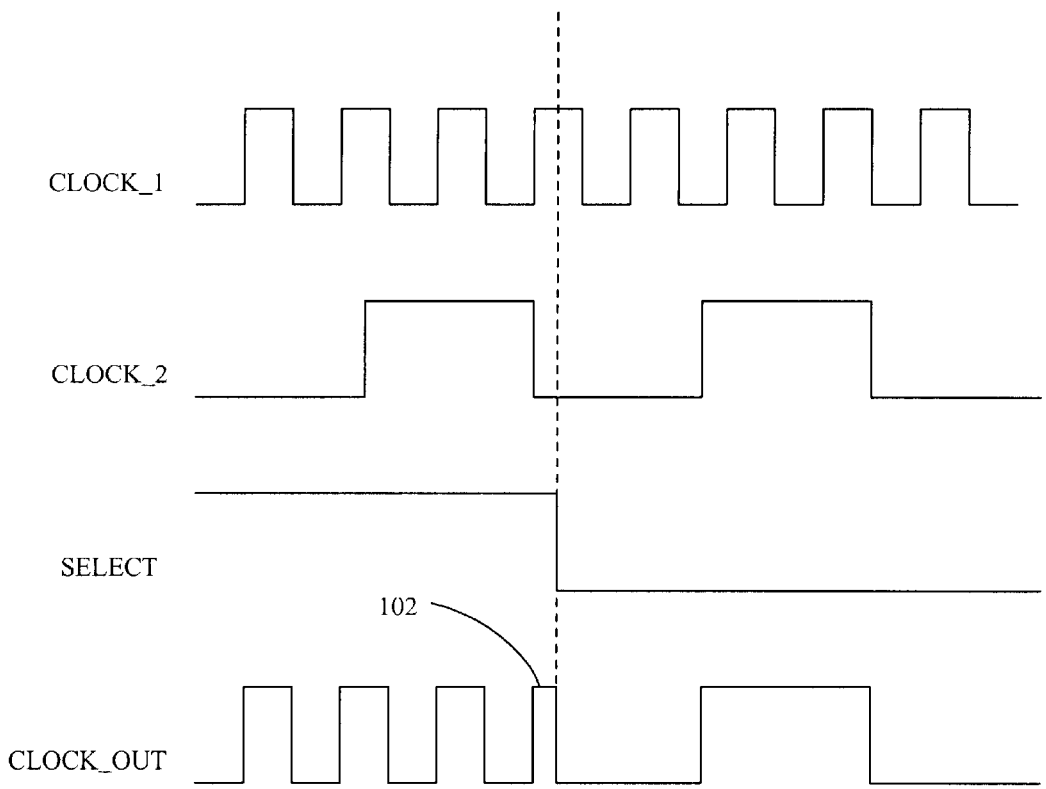
Figure 2A:
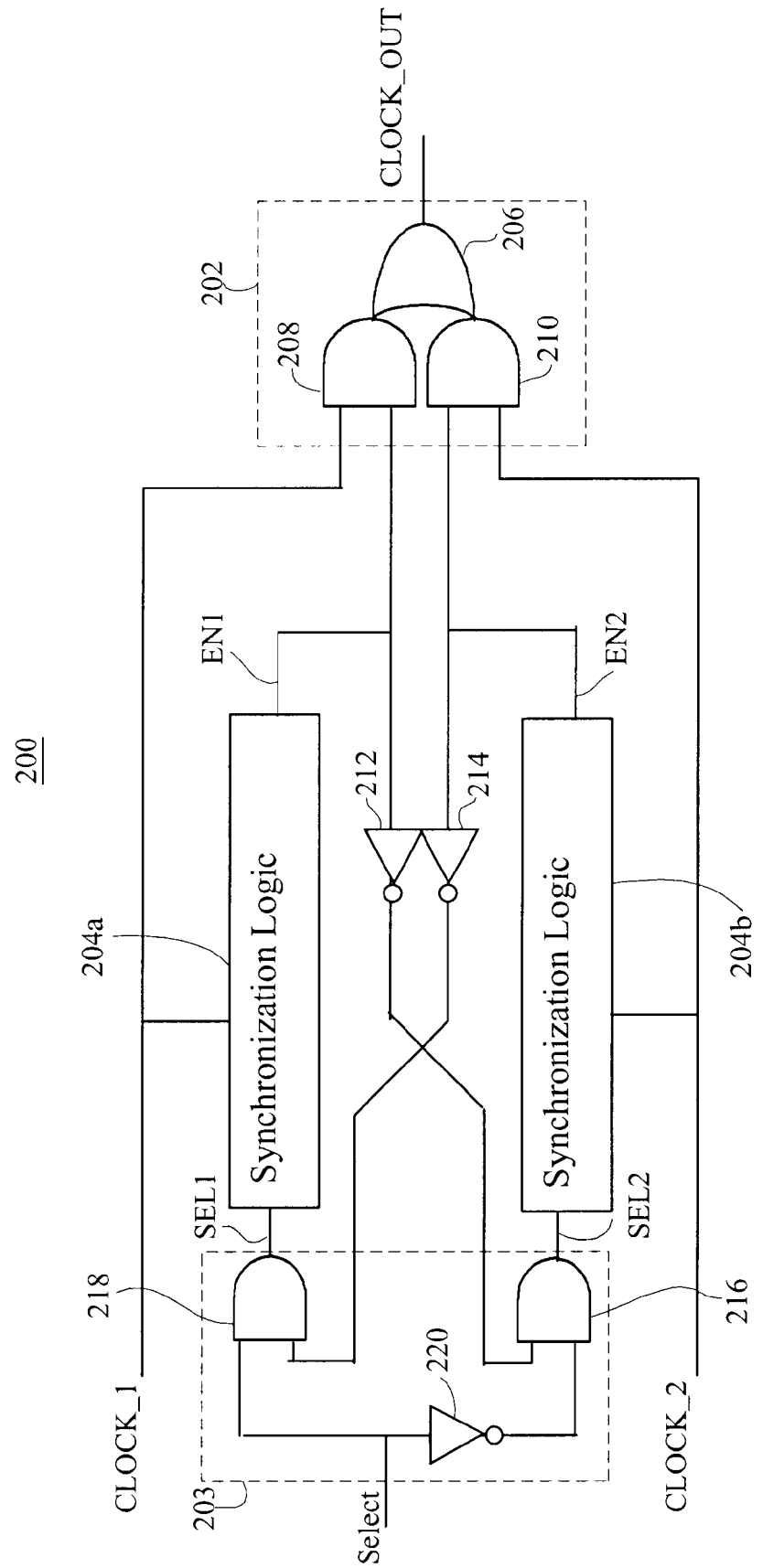
FIG. 2a illustrates a clock selection circuit according to the principles of the present invention.

FIG. 2a illustrates a clock selection circuit 200 according to the principles of the present invention. Selection circuit 200 generally comprises enable logic 203, synchronization logic 204a clocked by CLOCK_1, synchronization logic 204b clocked by CLOCK_2 and output logic 202.

Enable logic 203 generates internal select signals SEL1 and SEL2 based upon the Select input and the current state of the clock selection, i.e. whether CLOCK_1 is output or not and whether CLOCK_2 is output or not. Internal selection signals indicate which clock, CLOCK_1 or CLOCK_2, is to be output on CLOCK_OUT. Internal select signal SEL1 is input to synchronization logic 204a, while internal select signal SEL2 is input to synchronization logic 204b. Synchronization logic 204a generates an internal enable signal EN1 synchronously to CLOCK_1 based upon internal select signal SEL1. Likewise, synchronization logic 204b generates an internal enable signal EN2 synchronously to CLOCK_2 based upon internal select signal SEL2. Internal enable signals EN1 and EN2 are input to output logic 202 in addition to CLOCK_1 and CLOCK_2. The states of enable signals EN1 and EN2 determine which clock, CLOCK_1 or CLOCK_2, is output-by-output logic 202. Enable signals EN1 and EN2 are also fed back to enable logic 203 via inverters 212 and 214, respectively.

As shown, enable logic 202 comprises AND gates 218 and 216, and inverters 212. The output of AND gate 218 is SEL1 and the output of AND gate 216 is SEL2. One of the inputs of AND gate 218 is connected directly to the Select input, while one of the inputs of AND gate 216 is connected to the Select input via inverter 220. The other input of AND gate 216 is connected to EN1 via inverter 212. Similarly, the other input of AND gate 218 is connected to EN2 via inverter 214.

Synchronization logic 204a preferably comprises a plurality of cascaded memory elements or flip-flops, such as D flip-flops. The associated input clock, i.e. CLOCK_1, clocks each of the flip-flops, for example, on the negative edge of the input clock. The first flip-flop of the cascade has its input connected to SEL1 and the output of the last flip-flop of the cascade is EN1. In a similar fashion, synchronization logic 204b preferably comprises a plurality of cascaded flip-flops, such as D flip-flops. The associated input clock, i.e. CLOCK_2, clocks each of the flip-flops, for example, on the negative edge of the input clock. The first flip-flop of the cascade has its input connected to SEL2 and the output of the last flip-flop of the cascade is EN2.

While it is preferred to use a plurality of cascaded flip-flops, it is within the spirit of the present invention for synchronization logic 204a or 204b to be formed with a single flip-flop. The use of a plurality of cascaded flip-flops, however, is preferred as this decreases the possibility of a metastable condition.

Output logic 202 comprises an OR gate 206 with one input connected to the output of an AND gate 208 and the other input connected to the output of a second AND gate 210. AND gate 208 has one of its inputs connected to CLOCK_1 and the other input connected to the EN1. Similarly, AND gate 210 has one of its inputs connected to CLOCK_2 and the other input connected to the EN2. The output of OR gate 206 is taken as CLOCK_OUT.

Figure 2B:
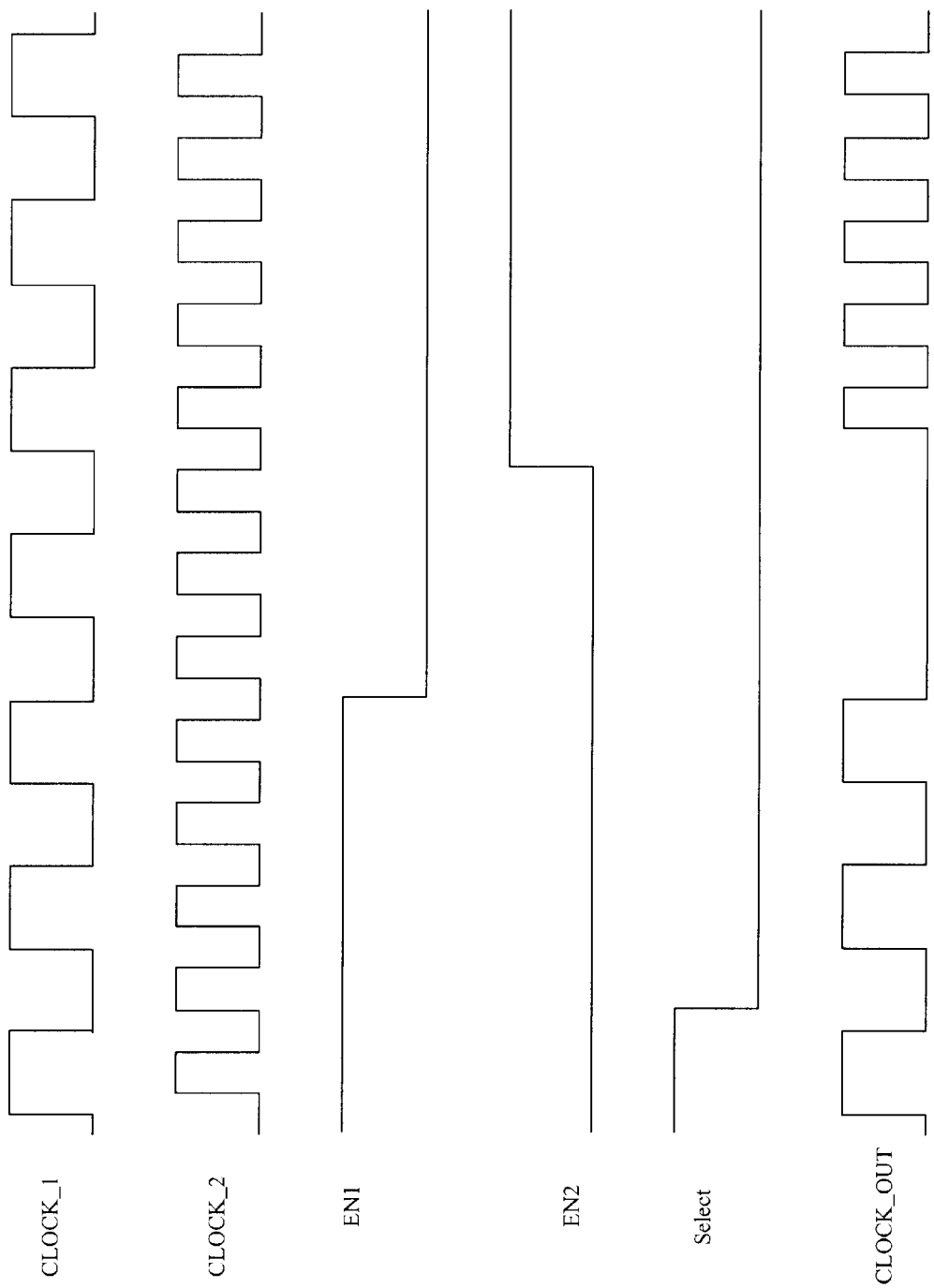

Discussion of the operation of selection circuit 200 for selecting between CLOCK_1 and CLOCK_2 will be made in conjunction with the timing diagram in FIG. 2b and is made starting from a state in which CLOCK 1 is output on CLOCK_OUT. Further, discussion of the operation of selection circuit 200 is made with respect to active high logic, while it is, however, within the spirit of the present invention to use active low logic.

Initially CLOCK_1 is output on CLOCK_OUT, EN1 is high, EN2 is low and Select is high. CLOCK_2 is chosen as the output clock by switching Select from high to low. When Select is switched low, this causes SEL1 to go low. Flip-flops 204a are clocked by CLOCK_1, causing the low input signal SEL1 to propagate to the output of synchronization flip-flops 204a, i.e. to EN1, synchronously with CLOCK_1. The signal EN1 going low disables the output of CLOCK_1 on CLOCK_OUT. The output EN1 going low also causes SEL2 to go high. Flip-flops 204b are clocked by CLOCK_2, causing the high input signal SEL2 to propagate to the output of synchronization flip-flops 204b, i.e. to EN2, synchronously with CLOCK_2. The output EN2 going high enables the output of CLOCK_2 on CLOCK_OUT. Therefore, as can be seen, the disabling of CLOCK_1 on CLOCK_OUT is performed synchronously with CLOCK_1 and the enabling of CLOCK_2 on CLOCK_OUT is performed synchronously with CLOCK_2, thereby preventing the occurrence of glitches during the switching of the clock output.

As will be illustrated below, the selection circuit according to the principles of the present invention can be expanded to include specific needs of the application, e.g. more control lines, power saving features, reduction of synchronization latency, etc. and to satisfy initialization requirements of synchronization logic 204.

Generally, clock selection circuit 200 is used to select a clock signal that clocks various components in a system. Select is typically initialized to a default value by the system after power up to provide an initial clock output on CLOCK_OUT. For example, Select is designed to default high. When Select defaults high on power up, SEL2 is initialized low. This low signal then propagates through synchronization logic 204b to EN2 to make EN2 take on a defined (low) value. After EN2 becomes low, then SEL1, which is high, can propagate through synchronization logic 204a to EN1. EN1 going high enables the output of CLOCK_1 on CLOCK_OUT. In some applications an output on CLOCK_OUT may be needed for the system to initialize Select. Or, in some applications the time needed to first propagate SEL2 through synchronization logic 204b then to propagate SEL1 through synchronization logic 204a may be too long. An ability to reset selection circuit 200 is desirable in these applications. In addition, a reset of selection circuit 200 may also be generally desirable so as to allow selection circuit 200 to be placed into a known state during normal operation.

Figure 2C:
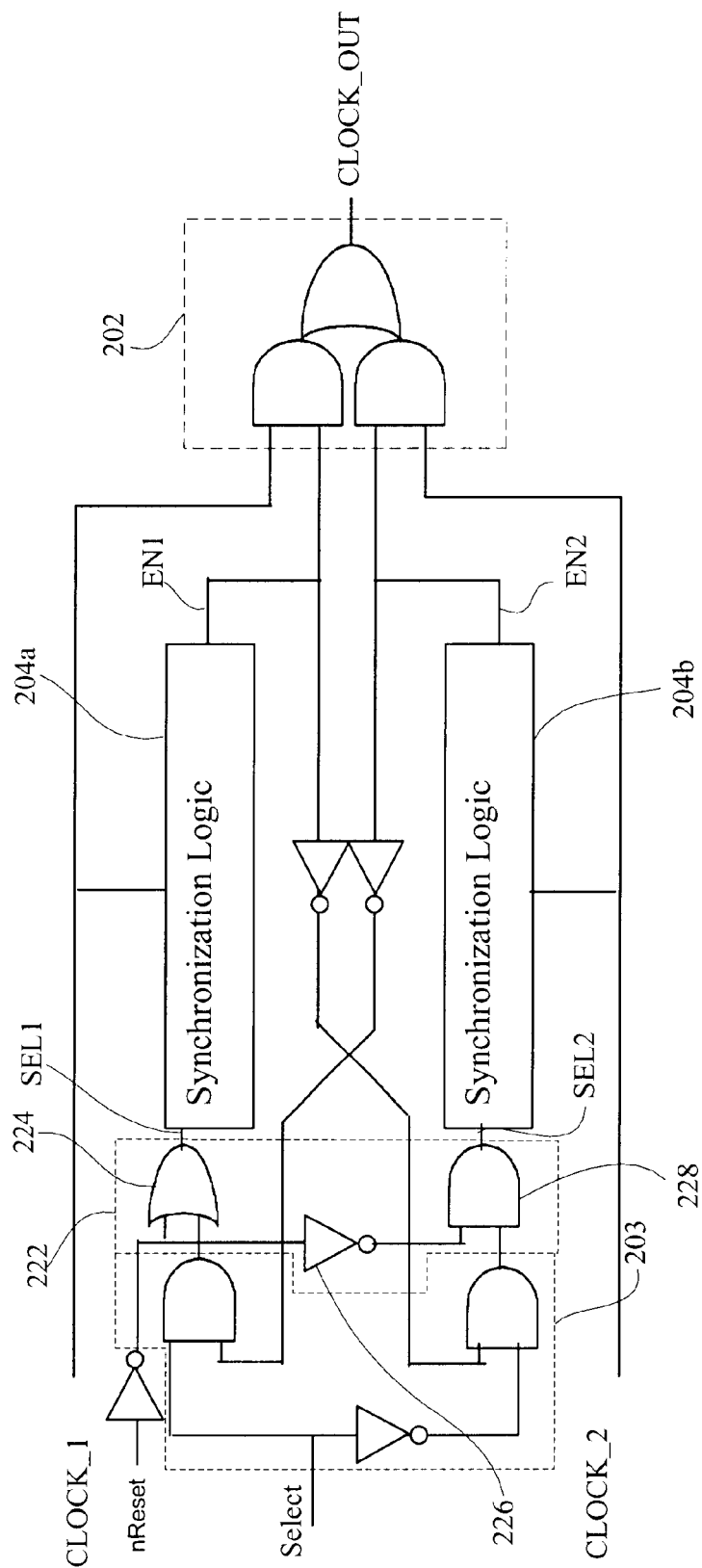
FIG. 2c illustrates an embodiment of clock selection circuit of FIG. 2a that allows for a synchronous reset of the synchronization logic.

FIG. 2c illustrates an embodiment of clock selection circuit 200 of FIG. 2a that allows for a synchronous reset of synchronization logic 204. By synchronous reset, it is meant that a nReset input changes state synchronously to the clock output on CLOCK_OUT. Selection circuit 200 operates as described in relation to FIGS. 2a and 2b, except that reset logic 222 causes the synchronization logic 204 to generate a particular state of the enable signals EN1 and EN2, regardless of the state of Select and the currently selected clock. This results in a particular clock being output when the nReset input is activated. As shown, the nReset signal is supplied to reset logic 222 via an inverter, making nReset active low. However, the inverter may not be needed depending on the reset logic 222. For instance, if nReset is desired to be active high, it can be provided straight to reset logic 222. In the embodiment illustrated in FIG. 2c, reset logic 222 comprises an OR gate 224, inverter 226 and an AND gate 228. OR gate 222 receives nReset and the output of AND gate 218 as inputs and its output is SEL1 to synchronization logic 204a. AND gate 228 receives nReset via inverter and the output of AND gate 216 as inputs and its output is SEL2 to synchronization logic 204b.

For the embodiment of FIG. 2c, nReset in a high state has no effect on which clock is enabled on CLOCK_OUT. When nReset is placed in a low state, however, SEL1 is forced high by reset logic 222, while SEL2 is forced low by reset logic 222. This causes CLOCK_1 to be enabled on CLOCK_OUT, regardless of the state of Select. As will be apparent to one of skill in the art, reset logic can readily be designed to cause CLOCK_2 to be output instead of CLOCK_1. For instance, interchanging the outputs of OR gate 224 and AND gate 228 such that the output of OR gate is SEL2 and the output of AND gate is SEL1, while removing the inverter nReset is supplied through, provides for reset logic which results in CLOCK_2 output when nReset is in a high state.

Figure 2D:
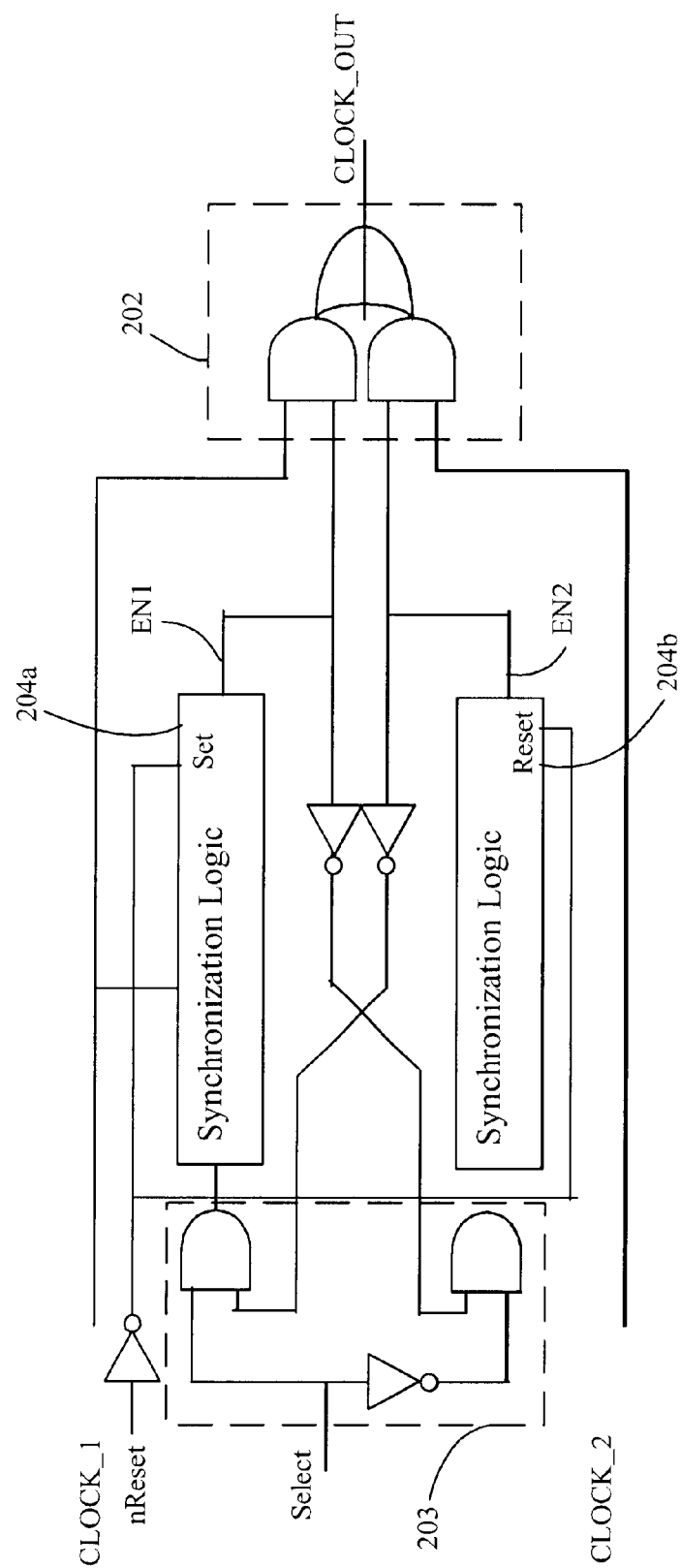
FIG. 2d illustrates an embodiment of clock selection circuit of FIG. 2a that allows for an asynchronous reset of synchronization logic.

FIG. 2d illustrates an embodiment of clock selection circuit 200 of FIG. 2a that allows for an asynchronous reset of synchronization logic 204. By asynchronous reset, it is meant that a nReset input changes state asynchronously from the clock output on CLOCK_OUT. Selection circuit 200 operates as described in relation to FIGS. 2a and 2b, except a nReset input causes the synchronization logic 204 to generate a particular state of the enable signals EN1 and EN2, regardless of the state of Select and the currently selected clock. This results in a particular clock being output when nReset is activated. The synchronization logic corresponding to the particular clock to be output has a set input connected to nReset, while the other synchronization logic has reset inputs connected to nReset. As shown in FIG. 2d, CLOCK_1 is the clock to be enabled on reset and, consequently, its synchronization logic 204a has a set input connected to nReset via an inverter. Synchronization logic 204b has a reset input connected to nReset via an inverter. A set input forces the output of its corresponding synchronization logic to go high when it is high. Conversely, a reset input forces the output of its corresponding synchronization logic to go low when it is high. For the set or reset inputs low, synchronization logic operate as normal. Therefore, when nReset is low, CLOCK_1 is enabled on CLOCK_OUT, while nReset high does not affect selection circuit 200.

Figure 2E:
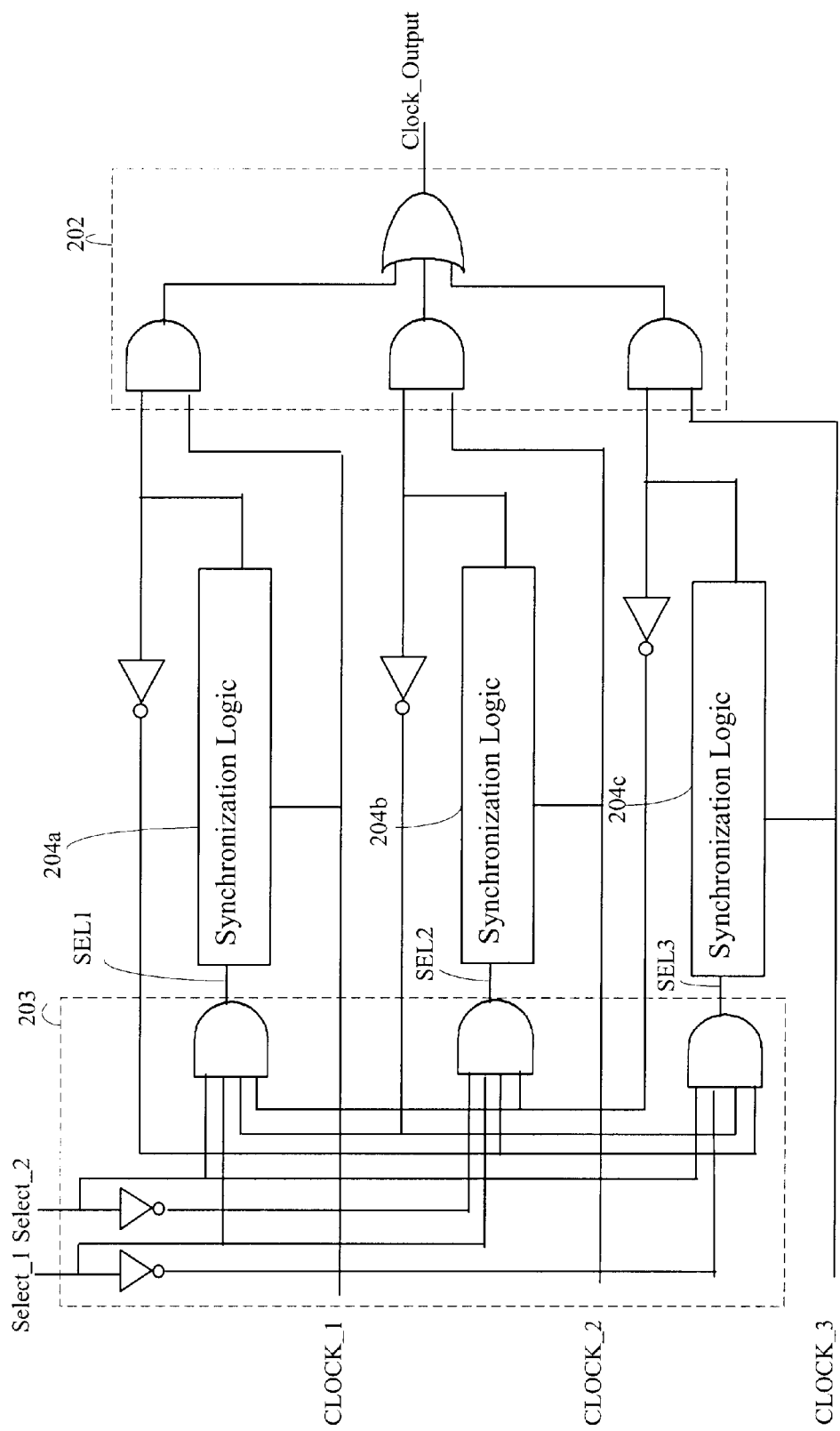
FIG. 2e illustrates the clock selection circuit of FIG. 2a extended to select between three clock sources.

A clock selection circuit according to the principles of the present invention can be extended to select between more than two clocks. FIG. 2e illustrates clock selection circuit 200 extended to select between three clock sources, CLOCK_1, CLOCK_2, and CLOCK_3. Selection circuit 200 is similar to the circuit of FIG. 2a and generally comprises enable logic 203, synchronization logic 204a clocked by CLOCK_1, synchronization logic 204b clocked by CLOCK_2 and output logic 202. Selection circuit 200 has been extended by the addition of synchronization logic 204c clocked by CLOCK_3 and the addition of logic in enable logic 203 to generate a third internal select signal SEL3. In addition, to provide selection between three clocks, the Select input is two Select lines, Select_1 and Select_2. Thus, the extended selection circuit 200 of FIG. 2e operates similar to the two-clock implementation. Enable logic 203 generates internal select signals SEL1, SEL2, and SEL3 based upon the Select input and the current state of the clock selection. Each of these signals is input to the corresponding synchronization logic 204a, 204b, and 204c, respectively. As with the two clock implementation, synchronization logic 204a, 204b, and 204c generates enable signals EN1, EN2, and EN3, respectively. The enable signals are generated based on the internal select signals such that an enabled clock is disable synchronously to itself and then the clock to be enabled is enabled synchronously to itself. The enable signals are provided to output logic 202 to control which clock is output and are fed back to enable logic to indicate the current state of the clock selection.

In the three-clock implementation shown, both of the Select inputs in a low state causes CLOCK_1 to be enabled on CLOCK_OUT. A low on both Select inputs results in SEL1 being high, while SEL2 and SEL3 are low. Depending upon which clock is already active, EN2 or EN3 goes low synchronously to its respective clock, disabling that clock. For instance, if CLOCK_2 is being output, EN2 goes low synchronously to CLOCK_2 (in this case EN3 would already be low so it does not change), causing CLOCK_2 to be disabled. Likewise, if CLOCK_3 is being output, EN3 goes low synchronously to CLOCK_3 (in this case EN2 would already be low so it does not change), causing CLOCK_3 to be disabled. After the previously enabled clock is disable, EN1 goes high synchronously to CLOCK_1 (it was low previously), causing CLOCK_1 to be enabled on CLOCK_OUT.

A low on Select_1 and a high on Select_2 causes CLOCK_2 to be enabled on CLOCK_OUT. A low on Select_1 and a high on Select_2 results in SEL2 being high, while SEL1 and SEL3 are low. Depending upon which clock is already active, EN1 or EN3 goes low synchronously to its respective clock, disabling that clock. For instance, if CLOCK_1 is being output, EN1 goes low synchronously to CLOCK_1 (in this case EN3 would already be low so it does not change), causing CLOCK_1 to be disabled. Likewise, if CLOCK_3 is being output, EN3 goes low synchronously to CLOCK_3 (in this case EN2 would already be low so it does not change), causing CLOCK_3 to be disabled. After the previously enabled clock is disable, EN2 goes high synchronously to CLOCK_2 (it was low previously), causing CLOCK_2 to be enabled on CLOCK_OUT.

A high on Select_1 and a low on Select_2 causes CLOCK_3 to be enabled on CLOCK_OUT. A high on Select_1 and a low on Select_2 results in SEL3 being high, while SEL1 and SEL2 are low. Depending upon which clock is already active, EN1 or EN2 goes low synchronously to its respective clock, disabling that clock. For instance, if CLOCK_1 is being output, EN1 goes low synchronously to CLOCK_1 (in this case EN2 would already be low so it does not change), causing CLOCK_1 to be disabled. Likewise, if CLOCK_2 is being output, EN2 goes low synchronously to CLOCK_2 (in this case EN1 would already be low so it does not change), causing CLOCK_2 to be disabled. After the previously enabled clock is disable, EN3 goes high synchronously to CLOCK_3 (it was low previously), causing CLOCK_3 to be enabled on CLOCK_OUT.

Lastly, a high on Select_1 and a high on Select_2 causes all clocks to be disabled, driving CLOCK_OUT low. A high on Select_1 and a high on Select_2 results in SEL1, SEL2, and SEL3 going low. In turn, any clock that was enabled will be disabled synchronously to itself and CLOCK_OUT will be driven low.

Figure 3:
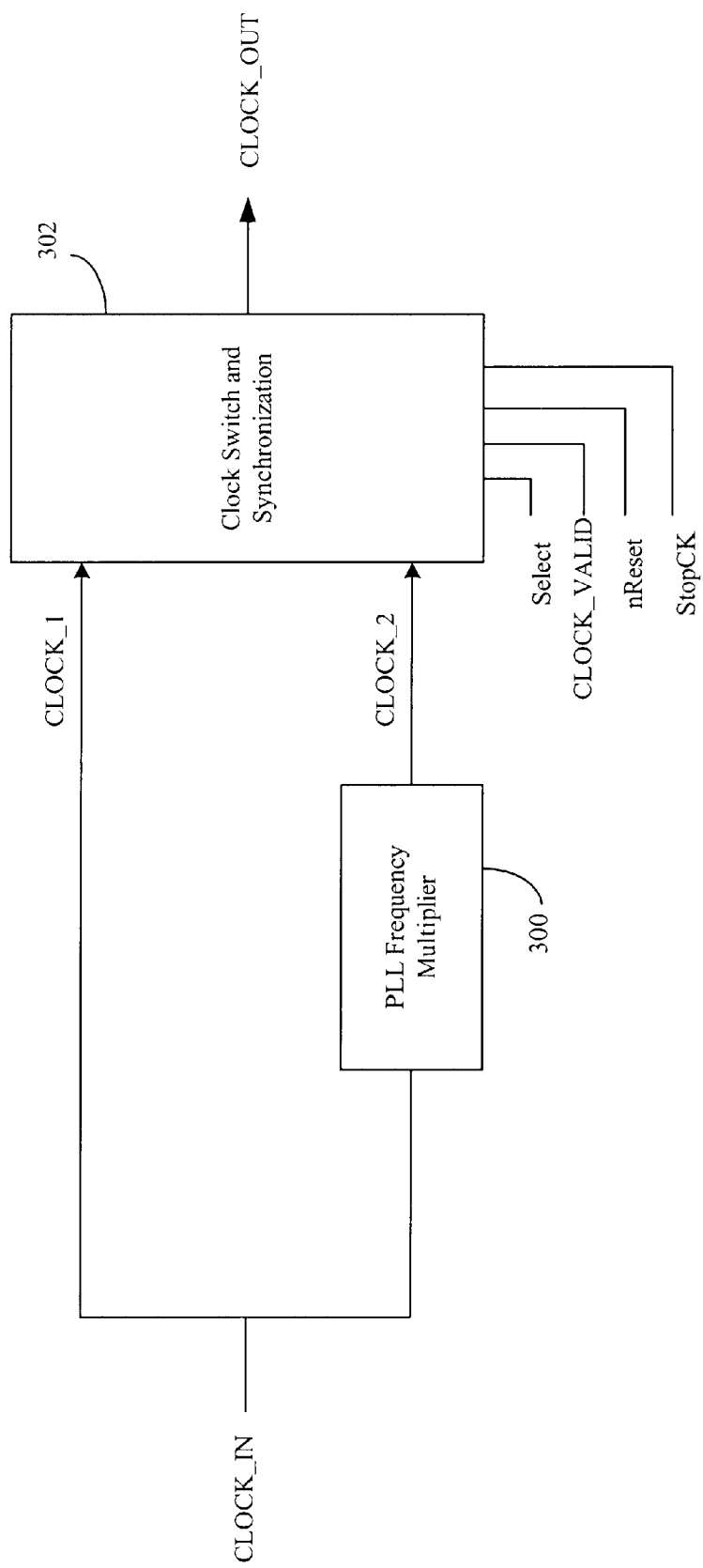
FIG. 3 illustrates the use of a clock selection circuit to for select between a base clock and a higher frequency clock created from a phase-locked loop (PLL) based frequency multiplier.

One exemplary application for a clock selection circuit according to the present invention is the selection between a base clock and a higher frequency clock created from a phase-locked loop (PLL) based frequency multiplier. This is generally illustrated in FIG. 3. As shown, a base clock signal CLOCK_IN is provided (as CLOCK_1) to a clock switch and synchronization circuit 302 according to the present invention. CLOCK_IN is also provided to a PLL frequency multiplier 300, which multiplies the frequency of CLOCK_IN to derive a clock signal CLOCK_2 having a higher frequency than CLOCK_1. The second clock signal CLOCK_2 is also provided to clock switch and synchronization circuit 302. A Select line is used to select between either CLOCK_1 or CLOCK_2 as the output on CLOCK_OUT. For instance, when Select is high, CLOCK_1 is output as CLOCK_OUT (i.e. the PLL frequency multiplier 300 is bypassed). When Select is low, however, CLOCK_2 is output as CLOCK_OUT.

Clock selection circuit 302 also has nReset, StopCK and CLOCK_VALID as control inputs. The control input nReset is an active low input that resets clock selection circuit 302. The StopCK input is used to stop the clock on the CLOCK_OUT output. When StopCK is high, CLOCK_OUT is stopped. The CLOCK_VALID input is used to prevent switching to the PLL clock, CLOCK_2, during the time when the PLL has not achieved lock. When the PLL has achieved lock, CLOCK_VALID goes high, allowing a switch to CLOCK_2.

Figure 4A:
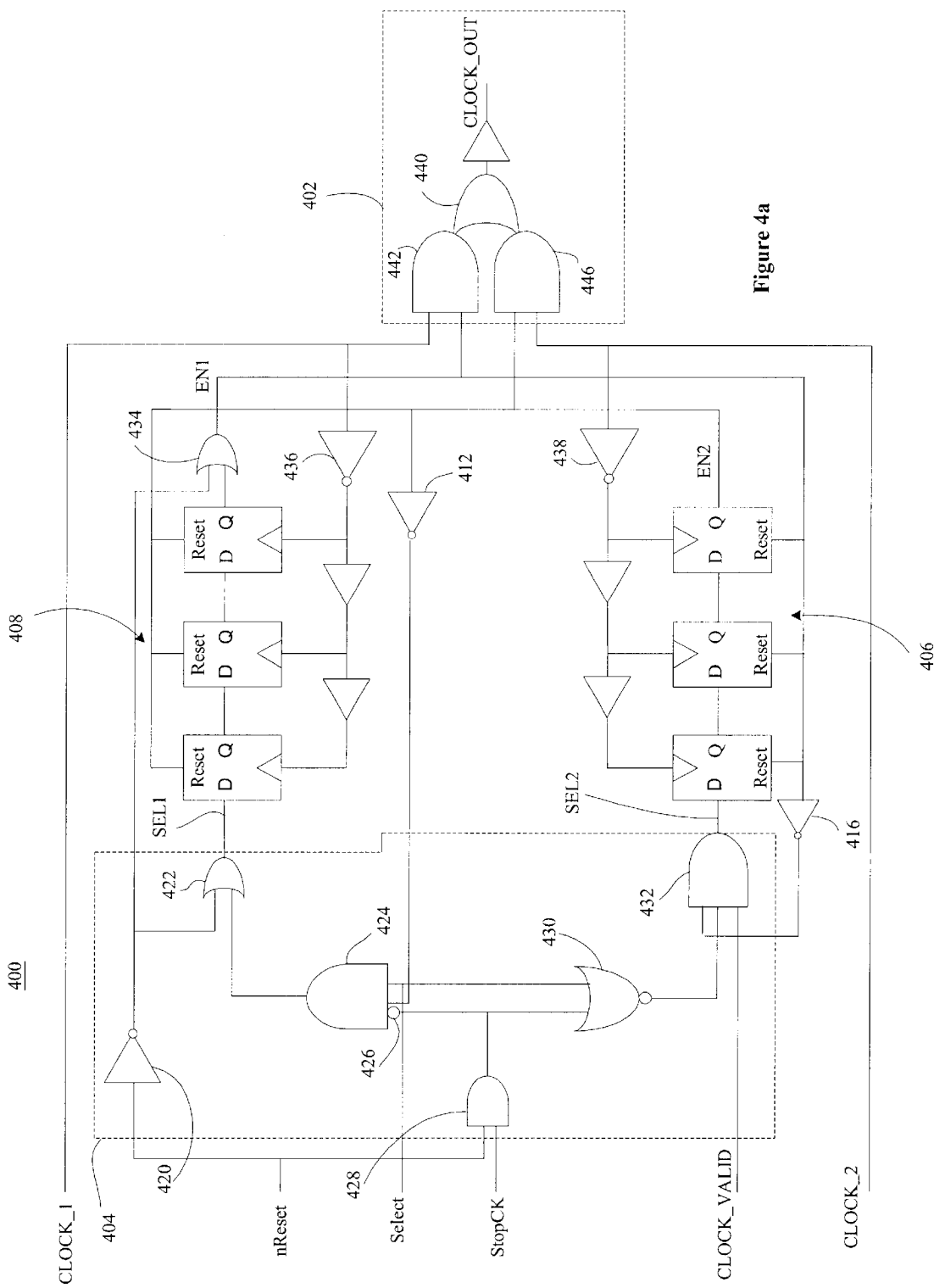
FIG. 4a illustrates a clock selection circuit 400 according to the principles of the present invention which is particularly suited to select between a base clock and a higher frequency clock created from a phase-locked loop (PLL) based frequency multiplier.

FIG. 4a illustrates a clock selection circuit 400 according to the principles of the present invention which is particularly suited to select between a base clock and a higher frequency clock created from a phase-locked loop (PLL) based frequency multiplier. Selection circuit 400 generally comprises enable logic 404, synchronization logic 408 clocked by CLOCK_1, synchronization 406 clocked by CLOCK_2 and output logic 402.

Enable logic 404 generates internal select signals SEL1 and SEL2 based upon input signals nReset, Select, StopCK and CLOCK_VALID and the current state of the clock selection, i.e. whether CLOCK_1 is output or not and whether CLOCK_2 is output or not. Internal select signal SEL1 is input to synchronization logic 408, while internal select signal SEL2 is input to synchronization logic 406. Synchronization logic 408 generates an internal enable signal EN1 synchronously to CLOCK_1 based upon internal select signal SEL1. Likewise, synchronization logic 406 generates an internal enable signal EN2 synchronously to CLOCK_2 based upon internal select signal SEL2. Internal enable signals EN1 and EN2 are input to output logic 402 in addition to CLOCK_1 and CLOCK_2. The states of enable signals EN1 and EN2 determine which clock, CLOCK_1 or CLOCK_2, is output-by-output logic 402. Enable signals EN1 and EN2 are also fed back to enable logic 404 via inverters 412 and 414, respectively.

As shown, enable logic 404 comprises AND gates 424, 428 and 432, inverters 420, NOR gate 430 and OR gate 422. The output of OR gate 218 is SEL1. One of the inputs of OR gate 218 is the output of inverter 420, which has the nReset signal as its input. The other input of OR gate is the output of AND gate 424. AND gate 424 receives as inputs the Select signal, EN2 via inverter 412 and the output of AND gate 428 via inverter 426. AND gate 428 receives the nReset signal and StopCK signal as inputs. The output of AND gate 432. AND gate 432 has the CLOCK_VALID signal, EN1 via inverter 416 and the output of NOR gate 430 as inputs. NOR gate 430 receives the Select signal and the output of AND gate 428 as inputs.

Similar to the embodiment of FIG. 2a, synchronization logic 408 preferably comprises a plurality of cascaded flip-flops, such as D flip-flops. Each of the flip-flops is clocked by the associated input clock, i.e. CLOCK_1, on the negative edge of the input clock as a result of inverter 434. In addition, each of the flip-flops has its reset input connected to EN2. The first flip-flop of the cascade receives SEL1 as its input. Synchronization logic 408 also comprises OR gate to facilitate the reset function of nReset. The output of inverter 420 is one input of OR gate 434. The output of the last flip-flop of the cascade is the other input to OR gate 434. The output of OR gate 434 is EN1. Similarly, synchronization logic 406 preferably comprises a plurality of cascaded flip-flops, such as D flip-flops. Each of the flip-flops is clocked by the associated input clock, i.e. CLOCK_2, on the negative edge of the input clock as a result of inverter 438. In addition, each of the flip-flops has its reset input connected to EN1. The first flip-flop of the cascade receives SEL2 as its input and the output of the last flip-flop of the cascade is EN2.

As previously described above in conjunction with the embodiment of FIG. 2a, the use of a plurality of flip-flops rather than a single flip-flop reduces the possibility of a metastable condition.

It is preferable to apply EN1 and EN2 to the reset inputs of the opposite set of flip-flops as shown to cause the opposite set of flip-flops to be in a reset state as described below. This insures that the opposite internal enable signal is low when one of the internal enable signals is high.

Output logic 402 comprises an OR gate 440 with one input connected to the output of an AND gate 442 and the other input connected to the output of a second AND gate 446. AND gate 442 has one of its inputs connected to CLOCK_1 and the other input connected to EN1. Similarly, AND gate 446 has one of its inputs connected to CLOCK_2 and the other input connected to EN2. The output of OR gate 440 is taken as CLOCK_OUT.

Figure 4B:
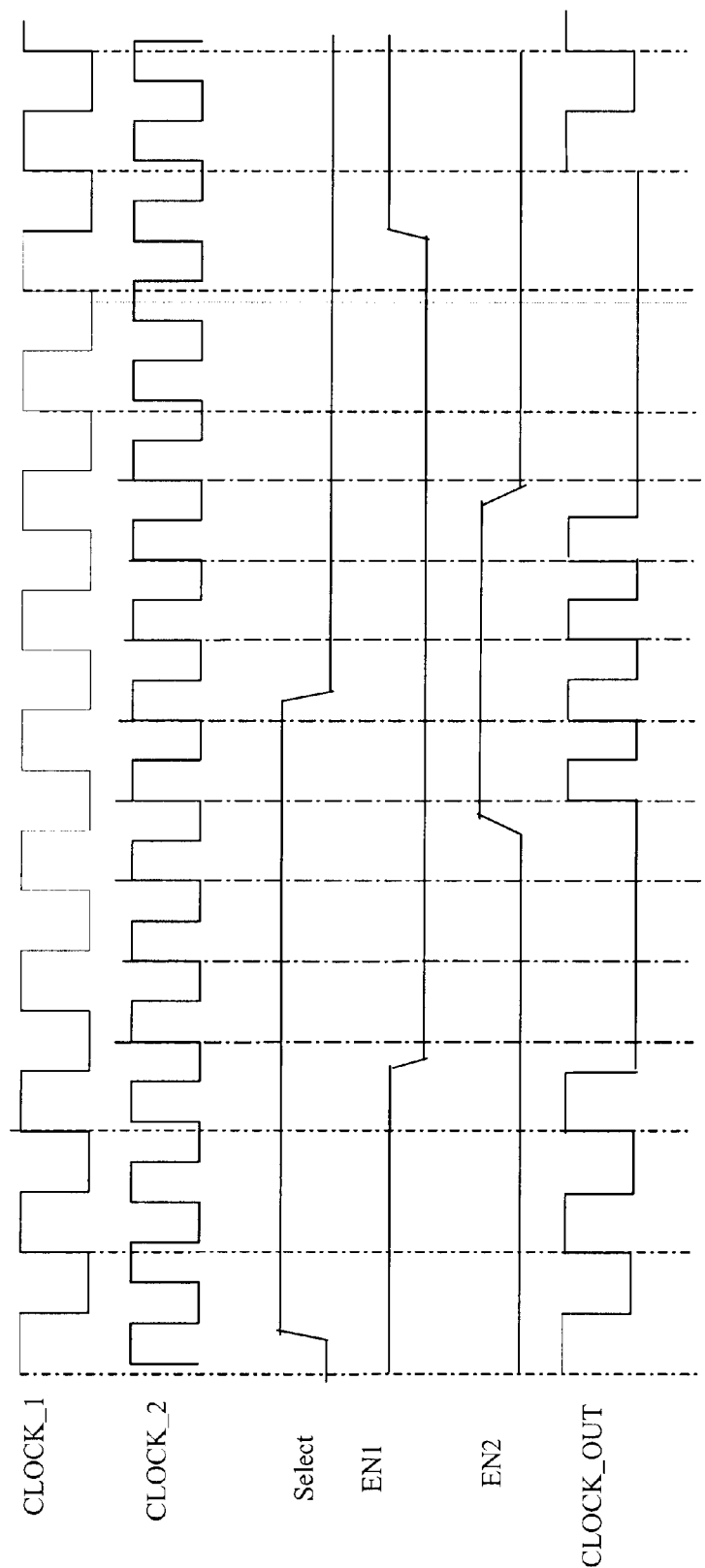

Discussion of the operation of selection circuit 400 for selecting between CLOCK_1 and CLOCK_2 will be made in conjunction with the timing diagram in FIG. 4b and is made starting from a state in which CLOCK_1 is output on CLOCK_OUT. Further, discussion of the operation of selection circuit 400 is made with respect to active high logic, while it is, however, within the spirit of the present invention to use active low logic.

It should be noted that selection circuit 400 provides for the ability of the inputs to change asynchronously with respect to the selected clock. This is because, before becoming fully operative on the output, a change to any of the inputs passes through synchronization flip-flops 406 and 408.

In the case of CLOCK_1 being output on CLOCK_OUT, Select and nReset are high, while StopCK is low. This results in internal selection signal SEL1 being high, while SEL2 is low. Internal enable signal EN1 is consequently high, which holds synchronization flip-flops 406 in a reset state, insuring internal enable signal EN2 is maintained in a low state. Because EN1 is high and EN2 is low, CLOCK_1 is output from output logic 402.

When CLOCK_2 is to be selected for output on CLOCK_OUT, Select is switched low, which causes SEL1 to switch low. As long as CLOCK_VALID is high, indicating PLL lock, switching Select low results in SEL2 going high. At this point, EN1 still holds flip-flops 406 in a reset state, preventing SEL2 from propagating to EN2.

Flip-flops 408, however, are not held in a reset state because EN2 is low. Therefore, SEL1 is propagated through flip-flops 408. Flip-flops 408 are clocked by the negative edge of CLOCK_1. This results in EN1 synchronously disabling the CLOCK_1 output on CLOCK_OUT by going low after a falling edge, but prior to a rising edge, of CLOCK_1. This synchronous disabling of CLOCK_1 on CLOCK_OUT prevents a glitch output.

Internal enable signal EN1 going low removes flip-flops 406 from a reset state. Therefore, SEL2 is propagated through flip-flops 406. Flip-flops 406 are clocked by the negative edge of CLOCK_2. This results in EN2 synchronously enabling the CLOCK_2 output on CLOCK_OUT by going high after a falling edge, but prior to a rising edge, of CLOCK_2. This synchronous enabling of CLOCK_2 on CLOCK_OUT prevents a glitch output. Further, internal enable signal EN2 going high causes flip-flops 408 to enter a reset state, which maintains EN1 low.

As previously described, operation of selection circuit also depends upon the inputs CLOCK_VALID, nReset and StopCK. CLOCK_VALID is a signal indicating the clock input CLOCK_2 is good or valid and that switching can proceed. In the present embodiment, when the PLL has not achieved lock and, therefore, CLOCK_2 is not valid, CLOCK_VALID is low causing SEL2 to be low. This prevents CLOCK_2 from being output even if Select is low. Thus, CLOCK_VALID prevents the switching to CLOCK_2 while the PLL is not in lock (i.e., while CLOCK_2 is not valid). A similar signal could exist for CLOCK_1, or any other clock to be switched.

Figure 4C:
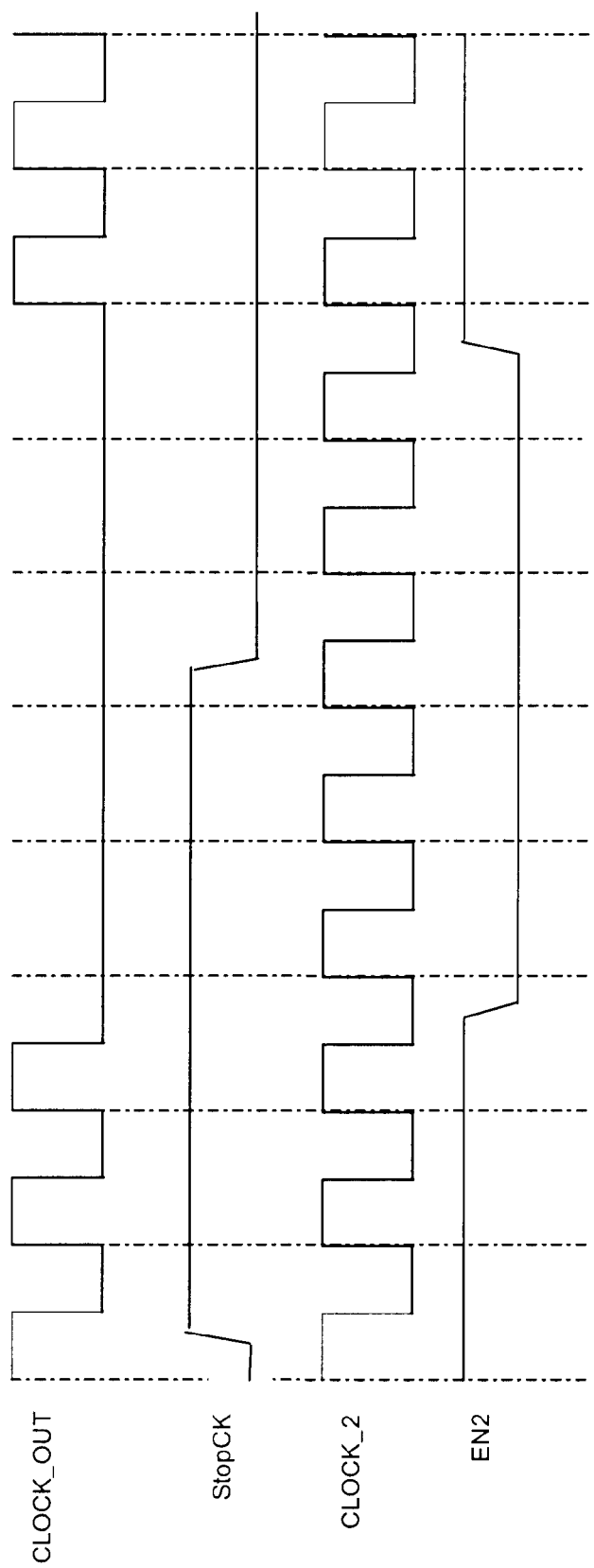

StopCK stops the output on CLOCK_OUT and nReset places selection circuit 400 in a reset state. When StopCK goes high, both SEL1 and SEL2 go low, thereby causing both EN1 and EN2 to be low, which stops the output on CLOCK_OUT, as shown in FIG. 4c. When nReset goes low, EN1 and SEL1 are forced high, thereby forcing EN2 and SEL2 low. This results in CLOCK_1 being output on CLOCK_OUT.

Figure 4D:
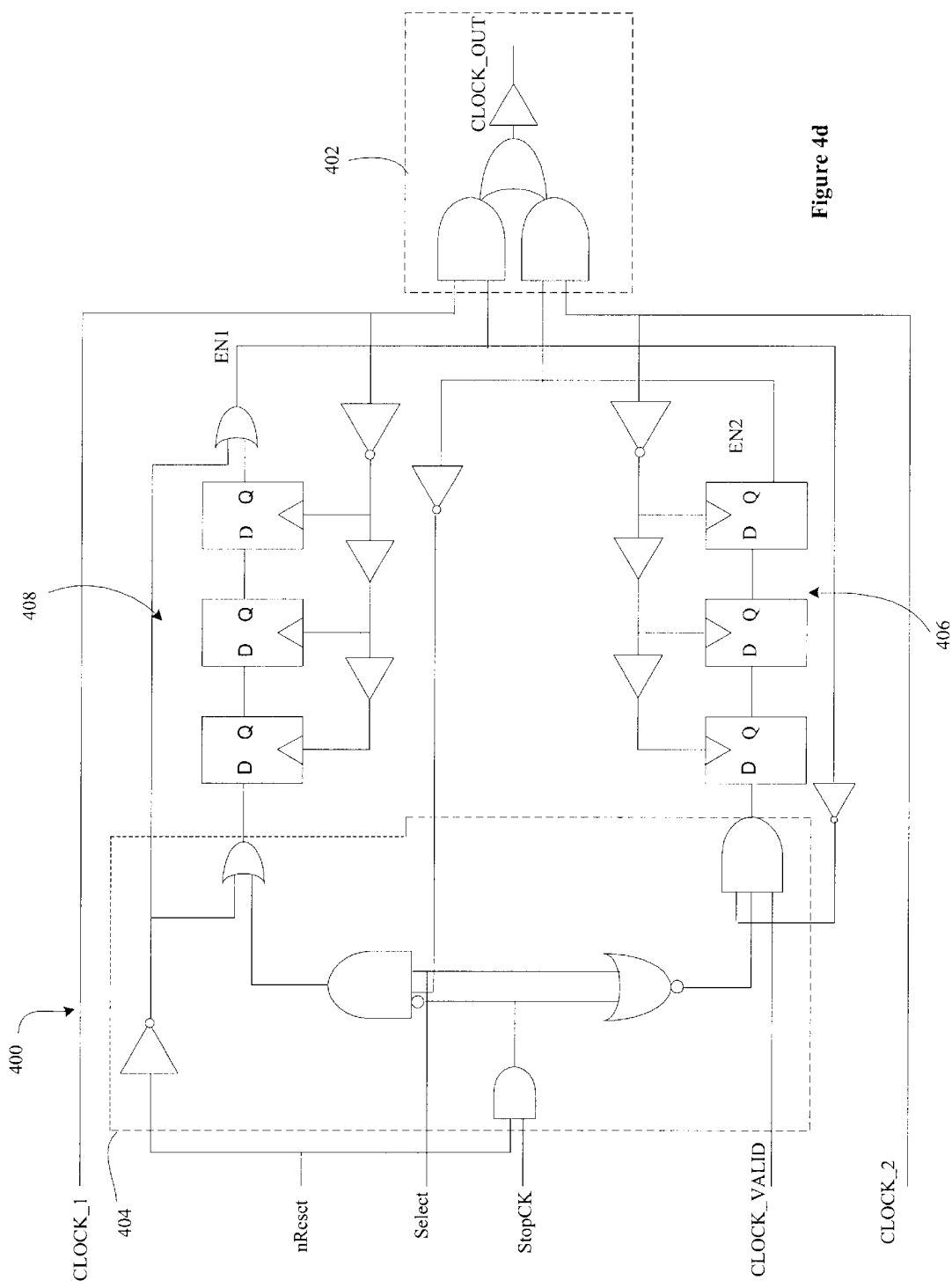
FIG. 4d illustrates an embodiment of the clock selection circuit of FIG. 4a without the internal enable signals connected to reset inputs of the flip-flops.

As would be apparent to one of skill in the art, arrangements in which the internal enable signals, EN1 and EN2, are not applied to the reset inputs of the flip-flops are possible. This is illustrated in FIGS. 4d and 4e. As can be seen, the embodiment of FIG. 4d is the same as the embodiment of FIG. 4a, except the internal enable signals, EN1 and EN2, are not connected to the reset inputs of the opposite flip-flops.

In the embodiment of FIG. 4e, EN1 and EN2 are not connected to the resets of the opposite flip-flops. In this embodiment, however, nReset is connected to the set inputs of flip-flops 408 via inverter 404. Similarly, nReset is connected to the reset inputs of flip-flops 406 via an inverter 450. OR gates 434 and 422 are eliminated, with the output of AND gate 424 as SEL1 going directly to the first flip-flop of flip-flops 408. In this embodiment, nReset going low causes EN1 to go high because of the set inputs, while EN2 goes low because of the reset inputs.

Figure 5A:
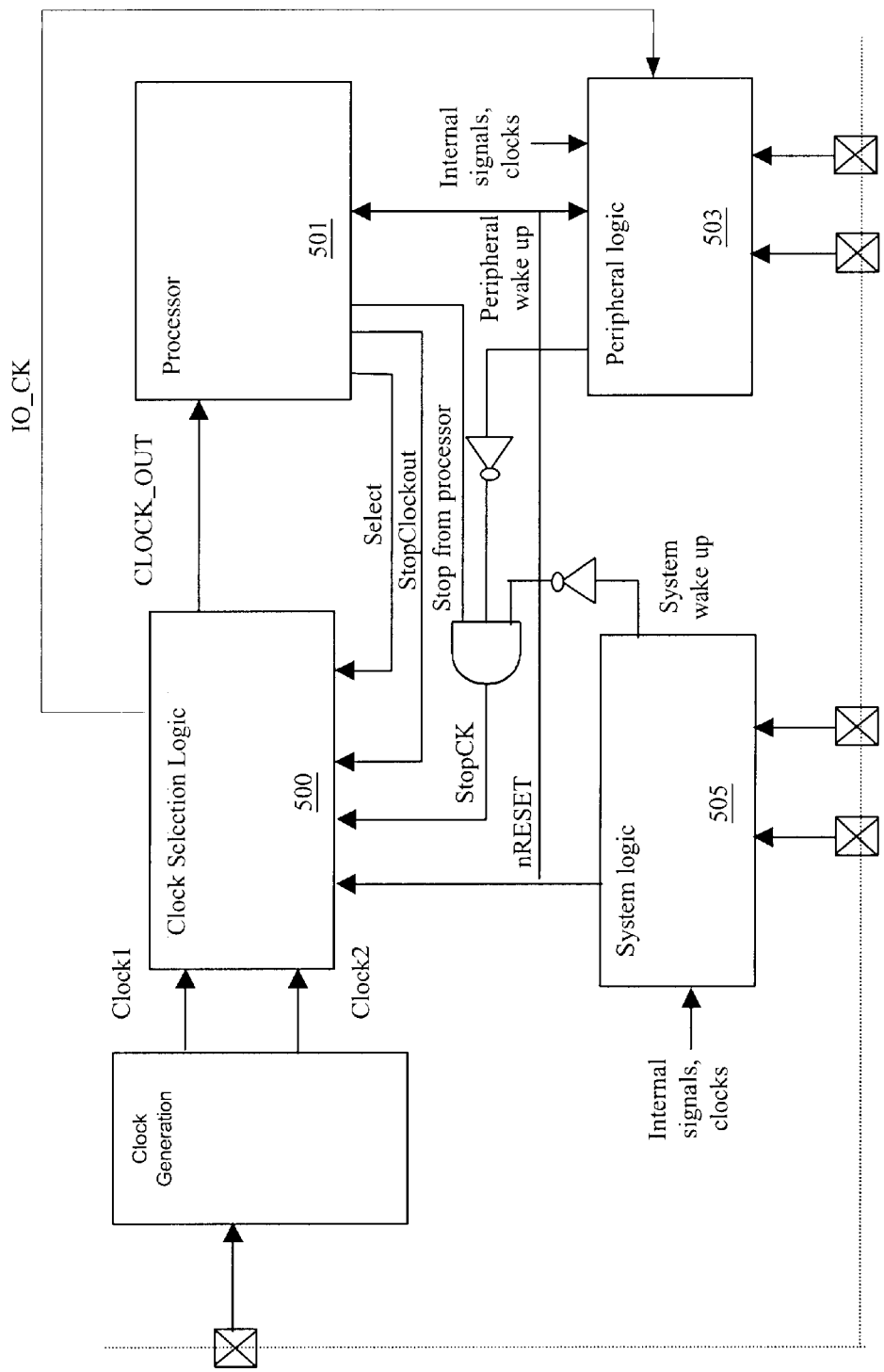
FIG. 5a illustrates an arrangement in which a clock selection circuit according to the principles of the present invention is used to clock a processor that issues the clock selection circuit's control inputs.

Another embodiment of the present invention is designed for control signals (i.e. Select, StopCK, and StopClockout) that change synchronously to the selected clock. This occurs, for example, when a clock selection circuit is used to clock a processor that issues the control signals, as shown in FIG. 5a. A processor 501 is clocked by the CLOCK_OUT signal of a clock selection circuit 500 designed according to the principles of the present invention. Some of the control inputs of clock selection circuit 500, i.e. Select and nReset are provided to selection circuit 500 by processor 501. StopCK is generated as a combination of outputs from processor 501, peripheral logic 503 and system logic 505. Because CLOCK_OUT clocks processor 501, Select, nReset and StopCK change synchronously to whichever clock, CLOCK_1 or CLOCK_2, is selected for output on CLOCK_OUT.

Figure 5B:
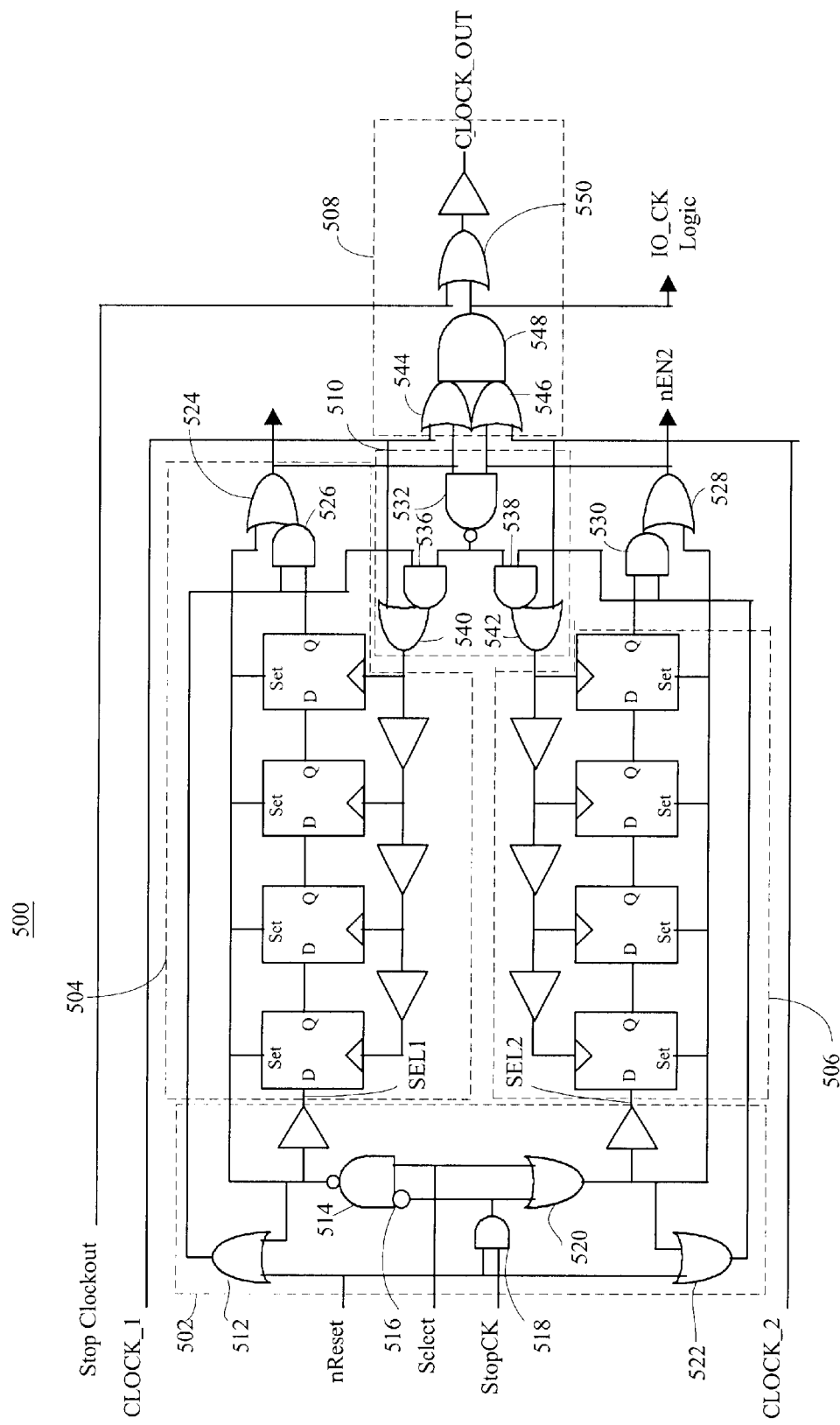
FIG. 5b illustrates a clock selection circuit according to the principles of the present invention which is particularly suited for control signals that change synchronously with the selected clock.

As illustrated in FIG. 5b, selection circuit 500 generally comprises enable logic 502, synchronization logic 504 clocked by CLOCK_1, synchronization logic 506 clocked by CLOCK_2, output logic 508 and power control logic 510.

Enable logic 502 generates internal select signals SEL1 and SEL2 based upon input signals nReset, Select, and StopCK. Internal select signal SEL1 is input to synchronization logic 504, while internal select signal SEL2 is input to synchronization logic 506. Synchronization logic 504 generates an internal enable signal EN1 synchronously to CLOCK_1 based upon internal select signal SEL1. Likewise, synchronization logic 506 generates an internal enable signal EN2 synchronously to CLOCK_2 based upon internal select signal SEL2. Internal enable signals EN1 and EN2 are input to output logic 502 in addition to CLOCK_1, CLOCK_2 and StopClockout. The states of enable signals EN1 and EN2 determine which clock, CLOCK_1 or CLOCK_2, is output-by-output logic 502. Enable signals EN1 and EN2 are also input to power control logic 510, in addition to CLOCK_1 and CLOCK_2. Power control logic 510, as described more fully below, controls the clocking of synchronization logic 504 and 506 based on the states of EN1 and EN2.

As shown, enable logic 502 comprises OR gates 512, 522 and 520, inverter 516, NAND gate 514, and AND gate 518. The output of NAND gate 514 is SEL1. One of the inputs of NAND gate 514 is the Select signal. The other input of NAND gate 518 is the output of inverter 420, which has the output of AND gate 518 as its input. AND gate 518 receives the nReset signal and StopCK signal as inputs. The output of OR gate 520 is SEL2. OR gate 520 receives the Select signal and the output of AND gate 428 as inputs.

The signal nReset is also provided to one of the inputs of OR gate 512. The other input of OR gate 512 is the output of NAND gate 514, i.e. SEL1. The output of OR gate 512 is provided to power control logic 510 and synchronization logic 504 in order to enable the function of nReset. Likewise, the signal nReset is provided to one of the inputs of OR gate 522. The other input of OR gate 522 is the output of OR gate 514, i.e. SEL2. The output of OR gate 522 is also provided to power control logic 510 in order to enable the function of nReset.

Synchronization logic 504 preferably comprises a plurality of cascaded flip-flops, such as D flip-flops. Each of the flip-flops is clocked by the associated input clock, i.e. CLOCK_1, on the positive edge of the input clock. The first flip-flop of the cascade receives SEL1 as its input. In addition, SEL1 is applied to the set input of each of the flip-flops. Synchronization logic 504 also comprises AND gate 524 and OR gate 526. The last flip-flop of the cascade has its output connected to AND gate 526, whose other input is the output of OR gate 512. The output of AND gate 526 is input to OR gate 524. The other input of OR gate 524 is SEL1. The output of OR gate 524 is EN1.

Likewise, synchronization logic 506 preferably comprises a plurality of cascaded flip-flops, such as D flip-flops. Each of the flip-flops is clocked by the associated input clock, i.e. CLOCK_2, on the positive edge of the input clock. The first flip-flop of the cascade receives SEL2 as its input. In addition, SEL2 is applied to the set input of each of the flip-flops. Synchronization logic 506 also comprises AND gate 530 and OR gate 528. The last flip-flop of the cascade has its output connected to AND gate 530, whose other input is the output of OR gate 522. The output of AND gate 530 is input to OR gate 528. The other input of OR gate 524 is SEL2. The output of OR gate 528 is EN2.

It should be noted that, similar to the other embodiments, the use of a plurality of flip-flops rather than a single flip-flop reduces the possibility of a metastable condition, however, use of a single flip-flop is possible.

Output logic 508 comprises an AND gate 548 with one input connected to the output of an OR gate 544 and the other input connected to the output of a second OR gate 546. OR gate 544 has one of its inputs connected to CLOCK_1 and the other input connected to EN1. Similarly, OR gate 546 has one of its inputs connected to CLOCK_2 and the other input connected to EN2. The output of AND gate 548 is input to OR gate 550. The other input of OR gate 550 is the signal StopClockout. The output of OR gate 550 is taken as CLOCK_OUT.

Power control circuit 510 comprises NAND gate 532, AND gates 536 and 538, and OR gates 540 and 542. NAND gate 532 receives EN1 and EN2 as inputs. The output of NAND gate 532 is input to AND gate 536. AND gate 536 also receives the output of OR gate 512 as an input. The output of AND gate 536 is one of the inputs to OR gate 540. The other input of OR gate 540 is CLOCK_1. Each clock input of the flip-flops receives the output of OR gate 540. The output of NAND gate 532 is also input to AND gate 538. AND gate 538 also receives the output of OR gate 522 as an input. The output of AND gate 538 is one of the inputs to OR gate 542. The other input of OR gate 540 is CLOCK_1. Each clock input of the flip-flops receives the output of OR gate 542.

Discussion of the operation of selection circuit 500 for selecting between CLOCK_1 and CLOCK_2 will be made in conjunction with the timing diagram in FIG. 5c and is made starting from a state in which CLOCK_1 is output on CLOCK_OUT.

In the case of CLOCK_1 being output on CLOCK_OUT, Select and nReset are high, while StopCK and StopClockout are low. This results in internal selection signal SEL1 being low, while SEL2 is high. Internal enable signal EN1 is consequently low, while enable signal EN2 is consequently high. Because EN1 is low and EN2 is high, CLOCK_1 is output on CLOCK_OUT from output logic 508.

As previously described, the enable signals EN1 and EN2 are also input to power control logic 510, in addition to CLOCK_1 and CLOCK_2. Power control logic 510 controls the clocking of synchronization logic 504 and 506 based upon the states of EN1 and EN2 in order to reduce the power usage of selection circuit 500. Therefore, when a clock is enabled for output, power control logic 510 prevents the clocking of synchronization logic 504 and 506, while, during switching between clocks or upon reset, power control logic 510 allows clocking of synchronization logic 504 and 506. As such, power control logic 510 prevents the clocking of synchronization logic 504 and 506 when CLOCK_1 is output.

When CLOCK_2 is to be selected for output on CLOCK_OUT, Select is switched low. Switching Select low results in SEL2 going low, while SEL1 and EN1 go high. Because the Select signal is synchronized to the clock currently selected, the output of CLOCK_1 on CLOCK_OUT can be disabled when Select is changed. That is, because Select is synchronized to the currently selected clock, disabling CLOCK_1 when Select changes disables CLOCK_1 synchronously to itself. The enabling of CLOCK_2 on CLOCK_OUT, however, must still be synchronized to CLOCK_2 in order to prevent a glitch output. Therefore, synchronization logic 506 maintains EN2 high.

As both EN1 and EN2 are high (indicating switching of the clocks), power control circuit 510 allows the clocking of synchronization logic 504 and 506. Therefore, SEL2 is propagated through synchronization logic 506. Synchronization logic 506 is clocked by the positive edge of CLOCK_1. This results in EN1 synchronously enabling the CLOCK_2 output on CLOCK_OUT by going low after a rising edge, but prior to a falling edge, of CLOCK_2. This synchronous enabling of CLOCK_2 on CLOCK_OUT prevents a glitch output. In addition, EN2, going high cause power control logic 510 to prevent the clocking of synchronization logic 504 and 506.

As previously described, operation of selection circuit 500 also depends upon the inputs nReset, StopCK and StopClockout. The signal nReset places selection circuit 500 in a reset state During initialization of the logic, nReset is low and Select is high. This forces the output of AND gate 514 to be low and the output of OR gate 520 to be high. Also the output of OR gate 512 is low. The output of OR gate 520 sets flip-flops synchronization logic 506, while the output of OR gate 512 forces CLOCK_1 to clock synchronization logic 504, which will be initialized after a few clock edges(i.e., SEL1 will propagate through the flip-flops).

Figure 5C:
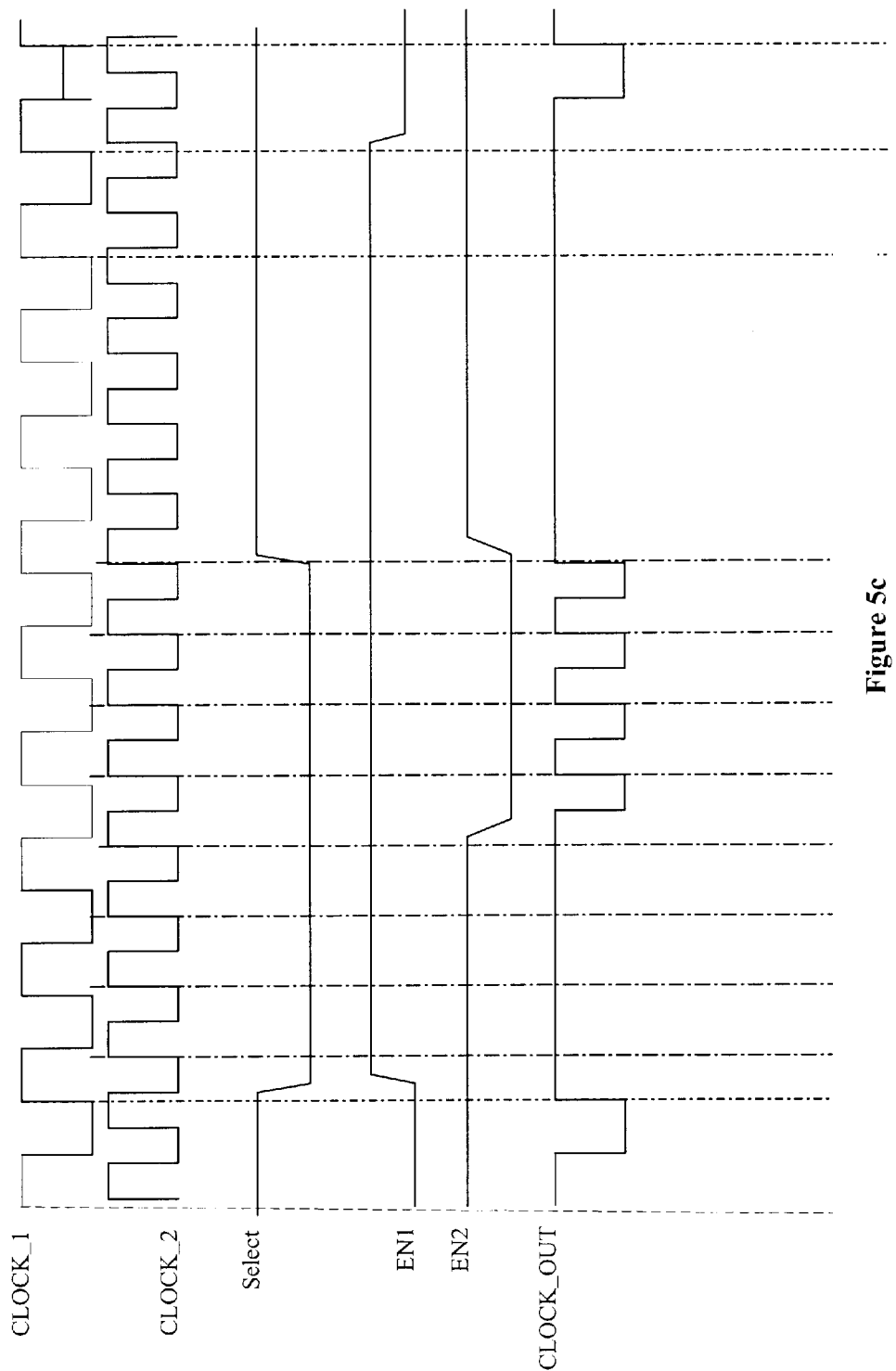
FIGS. 5c–5f illustrate timing diagrams for the selection circuit of FIG. 5b.
Figure 5D:
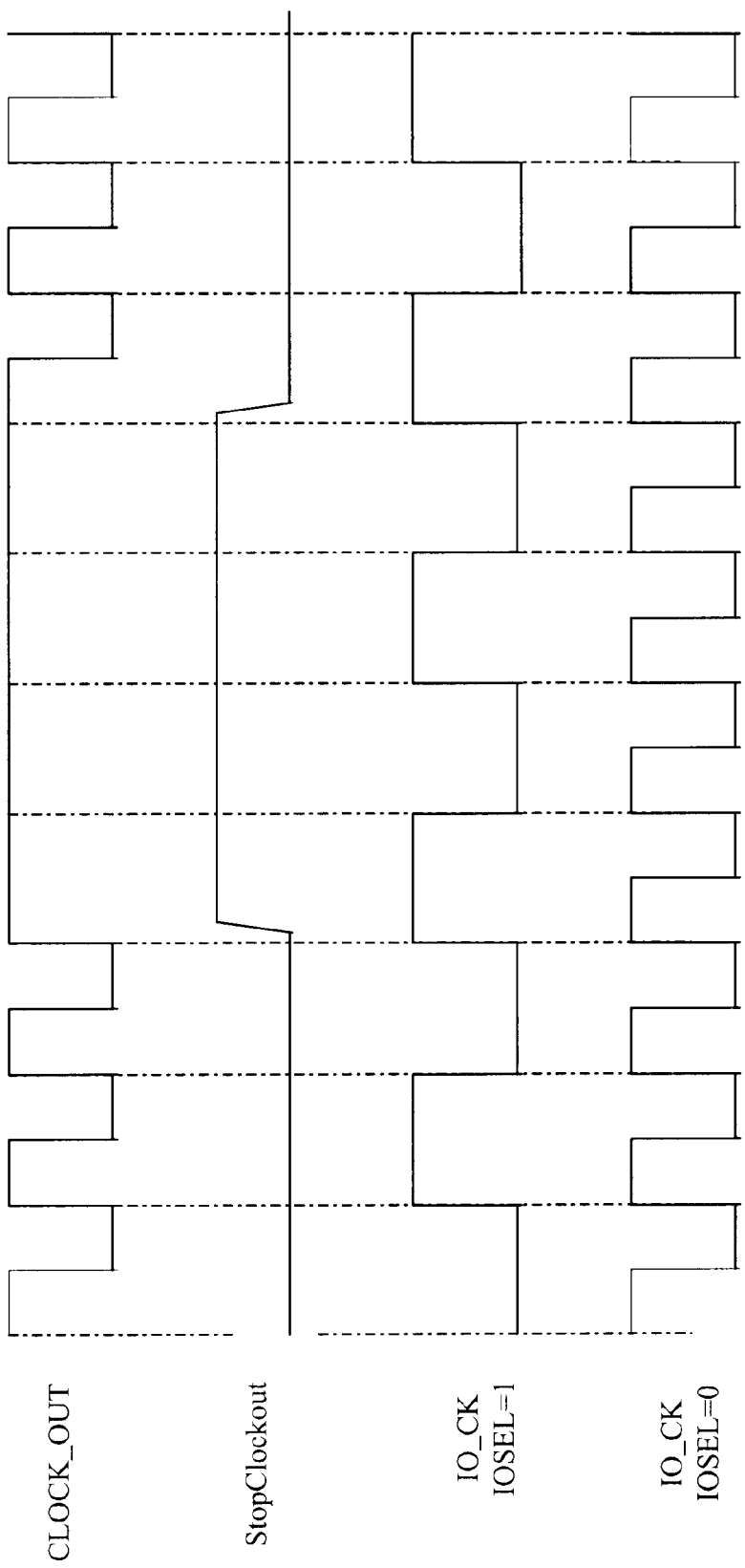

When StopClockout goes high, CLOCK_OUT is masked high, effectively preventing the output of either CLOCK_1 or CLOCK_2 on CLOCK_OUT, as shown in FIG. 5c. StopClockout is typically used by the processor clocked by selection circuit 500 to enter a power down mode in which it is not clocked. When a processor enters a power down mode, however, there must be a manner to wake up the processor. Therefore, secondary circuitry which still receives a clock signal and which can wake up the processor is used. So that the secondary circuitry can still receive a clock signal, preferably, a clock signal, IO_CK, is still available from selection circuit 500 while StopClockout is high. As such, when StopClockout is high, CLOCK_OUT remains high, but IO_CK continues to function as a clock signal.

Figure 5E:
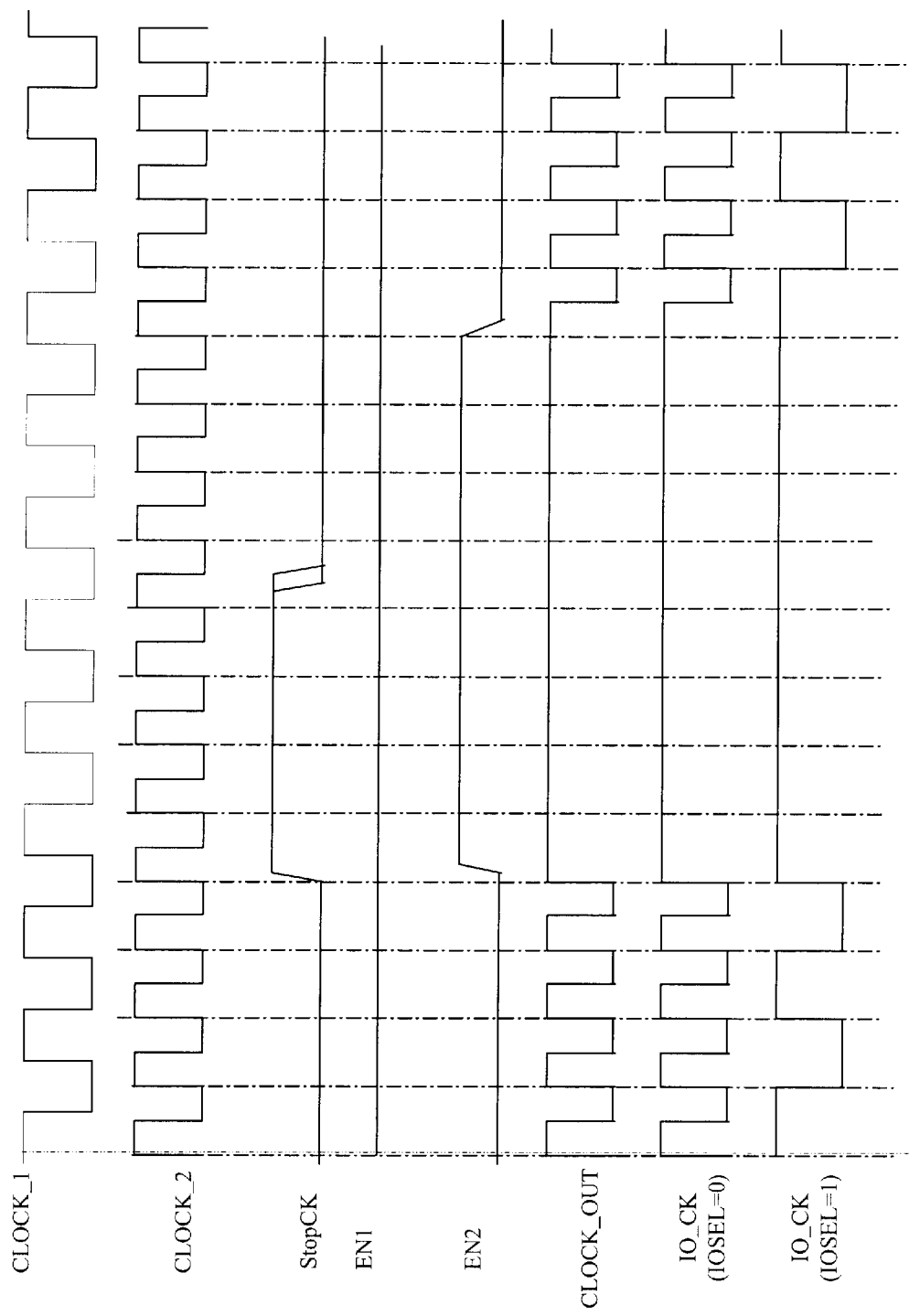
Figure 5F:
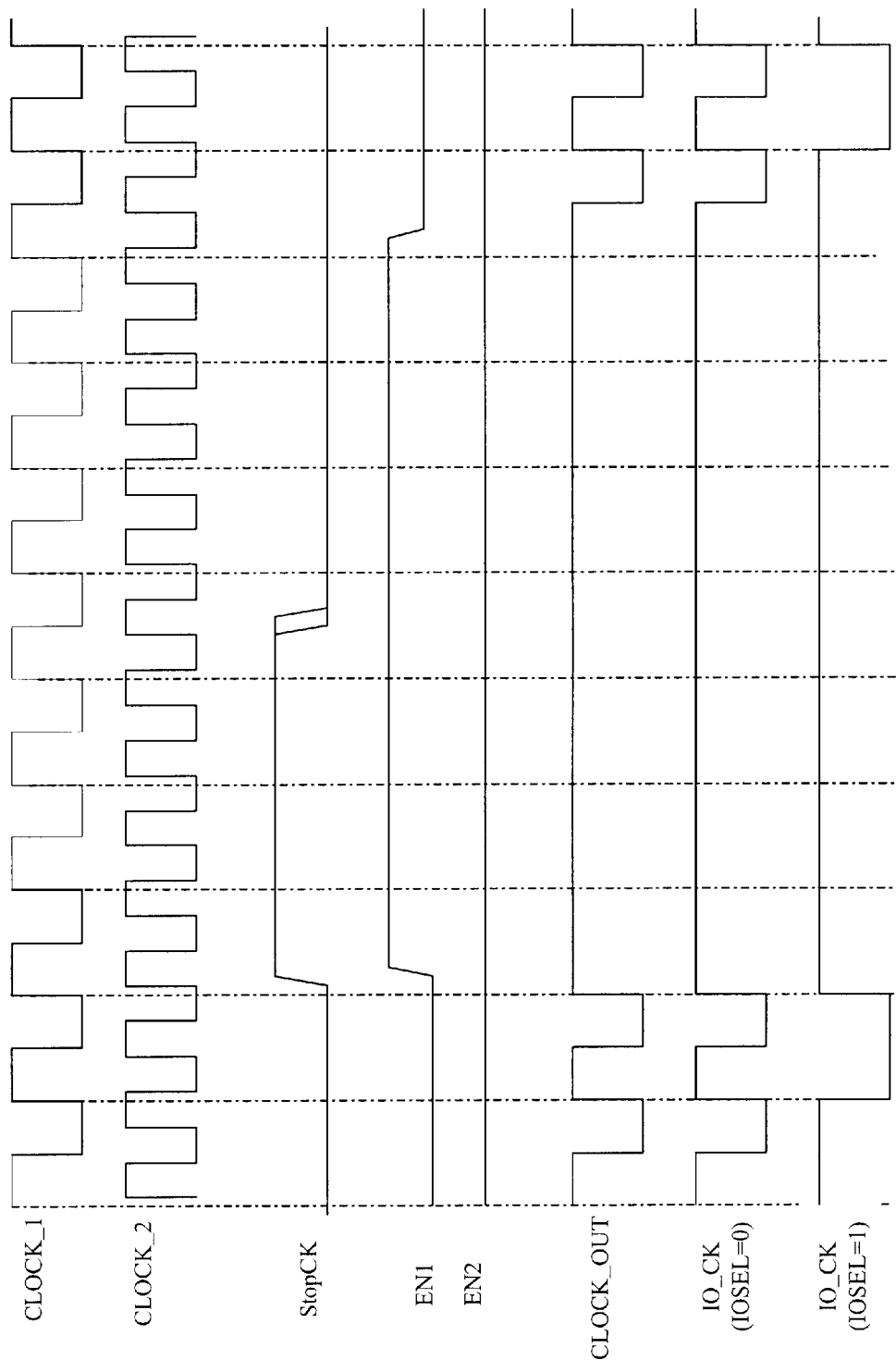

StopCK completely stops the output of selection circuit 500, including IO_CK. As can be seen with reference to FIG. 5e, when CLOCK_2 is output on CLOCK_OUT, EN1 is high and EN2 is low. When StopCK goes high EN1 goes high. This results in CLOCK_OUT and IO_CK remaining high. Likewise, as can be seen with reference to FIG. 5f, when CLOCK_1 is output on CLOCK_OUT, EN2 is high and EN1 is low. When StopCK goes high, EN2 goes high. This also results in CLOCK_OUT and IO_CK remaining high.

Although the present invention has been shown and described with respect to several preferred embodiments thereof, various changes, omissions and additions to the form and detail thereof, may be made therein, without departing from the spirit and scope of the invention.

What is claimed is:

1. A clock selection circuit, the circuit switching between a plurality of possible clocks, a switch made from an existing clock to a new frequency clock in synchronization with both existing and new frequency clocks, the clock selection circuit comprising:
   a first clock input to receive the existing clock as input;
   a new frequency clock input to receive the new frequency clock;
   first synchronization logic associated with the first clock input to enable/disable output of the existing clock, said first synchronization comprises a first set of one or more cascaded flip-flops, each of the flip-flops clocked by the existing clock signal;
   second synchronization logic associated with the new frequency clock to enable/disable output of the new frequency clock, said second synchronization comprises a second set of one or more cascaded flip-flops, each of the flip-flops clocked by the second clock signal; wherein
      the first synchronization and second synchronization logic cooperating to disable output of the existing clock synchronously to the existing clock and to enable output of the new frequency clock synchronously to the new frequency clock; and
      a power control logic to control clocking of the first and second sets of flip-flops such that the first and second sets of flip-flops are not clocked unless the first clock is being disabled and the new clock is being enabled.

2. The clock selection circuit, as per claim 1, wherein the existing clock is a base frequency clock and the new frequency clock is generated by a PLL frequency multiplier operating on the base frequency clock.

3. The clock selection circuit, as per claim 1, wherein the clock selection circuit is responsive to a stop input to stop all clock output.

4. The clock selection circuit, as per claim 1, wherein the clock selection circuit further comprises logic responsive to a clock valid input to prevent the second synchronization logic from enabling the new clock when the new clock is not valid.

5. The clock selection circuit, as per claim 1, wherein the clock selection circuit is responsive to a reset input to place the clock selection circuit in a known state regardless of a state of other inputs.

6. A clock selection circuit for outputting an input clock signal selected from among a plurality of input clocks comprising:
   enable logic responsive to a clock select input to generate, for each input clock, an associated select signal, each select signal indicative of whether or not its associated input clock is selected to be output;
   for each select signal, synchronization logic responsive to the select signal to generate an enable signal synchronously to the select signal's associated input clock, the enable signal indicative of whether or not the select signal's associated clock is to be output, said enable logic is additionally responsive to the enable signals when generating the select signals; and
   output logic responsive to the enable signals to output the selected input clock.

7. The clock selection circuit, as per claim 6, wherein at least one of the plurality of input clocks is generated by a PLL frequency multiplier.

8. The clock selection circuit, as per claim 6, wherein the clock selection circuit is responsive to a stop input to stop all clock output.

9. The clock selection circuit of claim 6, wherein the synchronization logic for each select signal comprises one or more cascaded flip-flops, each of the flip-flops clocked by the select signal's associated clock, a first one of the flip-flops receiving the select signal as an input.

10. The clock selection circuit, as per claim 9, wherein the enable signal is an output of a last one of the flips-flops.

11. The clock selection circuit of claim 9 further comprising:
    power control logic responsive to the enable signals to control clocking of the flip-flops.

12. The clock selection circuit, as per claim 6, wherein the clock selection circuit is responsive to a reset input to place the clock selection circuit in a known state regardless of a state of other inputs.

13. The clock selection circuit, as per claim 6, wherein the clock selection circuit further comprises logic responsive to a clock valid input to prevent enabling of the selected input clock when the selected input clock is not valid.

14. A clock selection circuit for switching from a first clock signal coupled to an output to a second clock signal coupled to the output, the circuit comprising:
    enable logic responsive to a clock select signal to generate a first select signal that indicates the first clock is to be decoupled from the output and a second select signal that indicates the second clock signal is to be coupled to the output;
    first synchronization logic responsive to the first select signal to generate a first enable signal synchronously to the first clock, the first enable signal indicating that the first clock is to be decoupled from the output;
    second synchronization logic responsive to the second select signal to generate a second enable signal synchronously to the second clock, the second enable signal indicating the second clock signal is to be coupled to the output;
    output logic responsive to the first enable signal to decouple the first clock signal from the output and responsive to the second enable signal to couple the second clock signal to the output; and
    wherein the first enable signal is generated before the second enable signal is generated, said enable logic is additionally responsive to the first and second enable signals when generating the first and second select signals.

15. The clock selection circuit, as per claim 14, wherein the clock selection circuit further comprises logic responsive to a clock valid input to prevent to generation of the second enable signal when the second clock is not valid.

16. The clock selection circuit, as per claim 14, wherein the clock selection circuit is responsive to a reset input to place the clock selection circuit in a known state regardless of a state of other inputs.

17. The clock selection circuit, as per claim 14, wherein at least one of the second clock is generated by a PLL frequency multiplier.

18. The clock selection circuit, as per claim 14, wherein the clock selection circuit is responsive to a stop input to stop all clock output.

19. The clock selection circuit of claim 14,
    wherein the first synchronization logic comprises:
       a first set of one or more cascaded flip-flops, each of the flip-flops clocked by the first clock signal, a first flip-flop of the first set receiving the first select signal; and
    the second synchronization logic comprises:
       a second set of one or more cascaded flip-flops, each of the flip-flops clocked by the second clock signal, a first flip-flop of the first set receiving the second select signal.

20. The clock selection circuit of claim 19 further comprising:

power control logic responsive to the first and second enable signals to control clocking of the first and second sets of flip-flops such that the first and second sets of flip-flops are not clocked.

* * * * *